(12) United States Patent
Schwarz et al.

(10) Patent No.: US 12,218,109 B2
(45) Date of Patent: Feb. 4, 2025

(54) ARRANGEMENT HAVING SEMICONDUCTOR COMPONENTS THAT EMIT ELECTROMAGNETIC RADIATION AND PRODUCTION METHOD THEREFOR

(71) Applicant: OSRAM Opto Semiconductors GmbH, Regensburg (DE)

(72) Inventors: Thomas Schwarz, Regensburg (DE); Sebastian Wittmann, Regenstauf (DE); Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 504 days.

(21) Appl. No.: 17/614,249

(22) PCT Filed: May 27, 2020

(86) PCT No.: PCT/EP2020/064731
§ 371 (c)(1),
(2) Date: Nov. 24, 2021

(87) PCT Pub. No.: WO2020/239852
PCT Pub. Date: Dec. 3, 2020

(65) Prior Publication Data
US 2022/0223570 A1 Jul. 14, 2022

(30) Foreign Application Priority Data
May 28, 2019 (DE) .......................... 102019114315.2

(51) Int. Cl.
*H01L 25/075* (2006.01)
*H01L 27/14* (2006.01)
(Continued)

(52) U.S. Cl.
CPC .......... *H01L 25/0753* (2013.01); *H01L 27/14* (2013.01); *H01L 33/005* (2013.01);
(Continued)

(58) Field of Classification Search
CPC .... H01L 25/0753; H01L 27/14; H01L 33/465
See application file for complete search history.

(56) References Cited

U.S. PATENT DOCUMENTS

2009/0256170 A1 10/2009 Shakuda
2011/0309377 A1* 12/2011 Braune ............... H01L 25/0753
438/26
(Continued)

FOREIGN PATENT DOCUMENTS

CN 101796660 B * 5/2012 .......... H01L 33/007
DE 102016124373 A1 6/2018
(Continued)

OTHER PUBLICATIONS

"EAST0808RGBA3", Everlight Americas Datasheet, Rev.0.01, Total pp. 12.
(Continued)

*Primary Examiner* — Mamadou L Diallo
(74) *Attorney, Agent, or Firm* — Slater Matsil, LLP

(57) ABSTRACT

In an embodiment an arrangement includes a plurality of optoelectronic semiconductor components arranged in a common plane, wherein each semiconductor component is laterally delimited by side faces, and wherein each semiconductor component includes a semiconductor body having an active region configured to emit electromagnetic radiation, a radiation outlet side configured to couple out the electromagnetic radiation, a rear face opposite to the radiation outlet side, and a contact structure arranged on the rear face, an output element, an electrically insulating insulation layer and an electrical connection structure, wherein the insulation layer is arranged between side faces of adjacent semiconductor components, wherein the output element is arranged at the radiation outlet sides of the semiconductor components, wherein the electrical connection structure is electrically conductively connected with the contact struc- (Continued)

ture, and wherein the connection structure includes an adhesive layer, a growth layer and a connection layer.

19 Claims, 23 Drawing Sheets

(51) Int. Cl.
  *H01L 33/00* (2010.01)
  *H01L 33/46* (2010.01)
  *H01L 33/62* (2010.01)

(52) U.S. Cl.
  CPC ............ *H01L 33/465* (2013.01); *H01L 33/62* (2013.01); *H01L 2933/0066* (2013.01)

(56) References Cited

U.S. PATENT DOCUMENTS

| | | | |
|---|---|---|---|
| 2014/0217425 A1 | 8/2014 | Kopp et al. | |
| 2014/0246747 A1* | 9/2014 | Tischler | H01L 31/02322 257/432 |
| 2015/0097208 A1* | 4/2015 | Sugizaki | H01L 33/382 257/99 |
| 2017/0309698 A1 | 10/2017 | Bower et al. | |
| 2018/0114887 A1* | 4/2018 | Herrmann | H01L 33/60 |

FOREIGN PATENT DOCUMENTS

| | | | |
|---|---|---|---|
| EP | 1162668 A2 | 12/2001 | |
| EP | 1162668 A3 | 7/2006 | |
| EP | 2053667 A2 | 4/2009 | |
| EP | 2053667 A3 | 5/2010 | |
| EP | 2858073 A2 * | 4/2015 | ............... C08K 3/22 |
| EP | 2858073 A3 | 6/2015 | |
| JP | 2013187371 A | 9/2013 | |
| WO | 2012107290 A1 | 8/2012 | |
| WO | 2018108823 A1 | 6/2018 | |

OTHER PUBLICATIONS

"Micro Clean LED Enables 4K Resolution TV Displays to 220", https://www.powersystemsdesign.com/articles/micro-clean-ledenables-4k-resolution-tvdisplays-to-220/36/15859, Jan. 2, 2022, Total pp. 5.
"Wikipedia: Glasinnengravur", https://de.wikipedia.org/w/index.php?title=Glasinnengravur&oldid=177130143, May 4, 2018, Total pp. 3.
"Schott Mirona®—Verwandlungsglas Glas und Spiegel in einem. Unser semi-transparentes Verwandlungsglas", https://www.schott.com/architecture/german/products/decorative-glass/mirona.html, May 23, 2019, Total pp. 3.

* cited by examiner

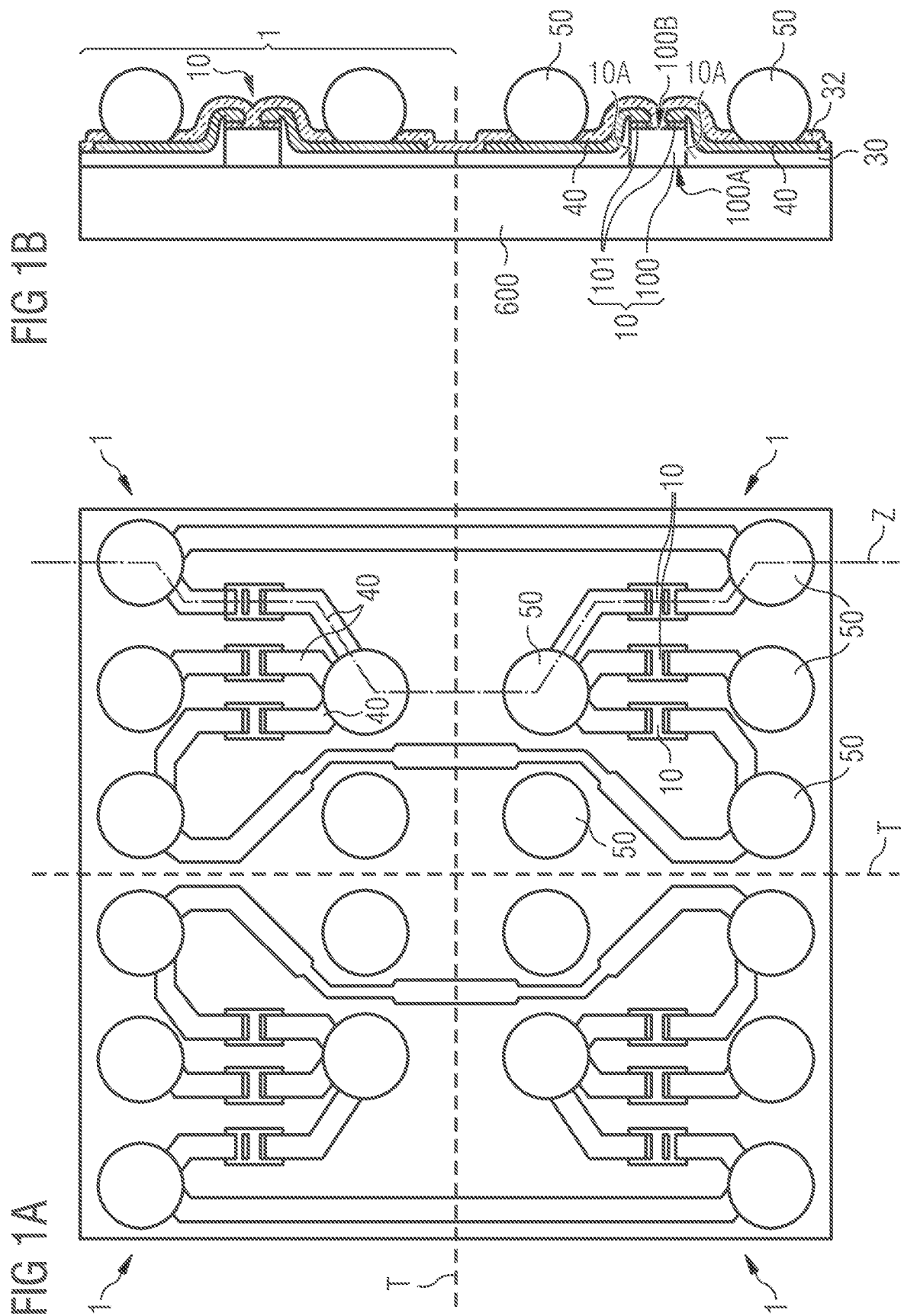

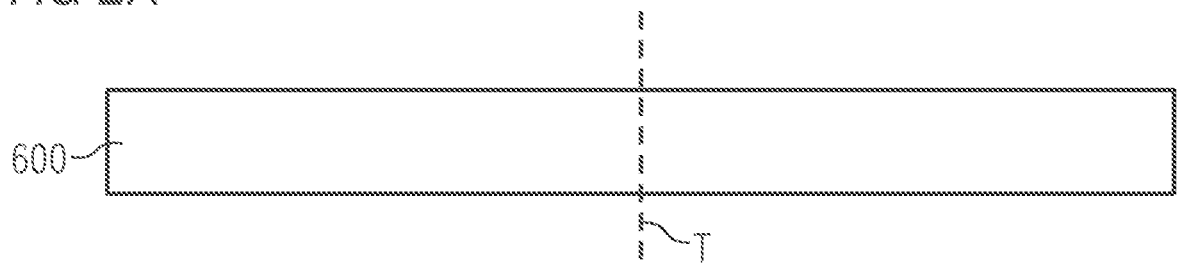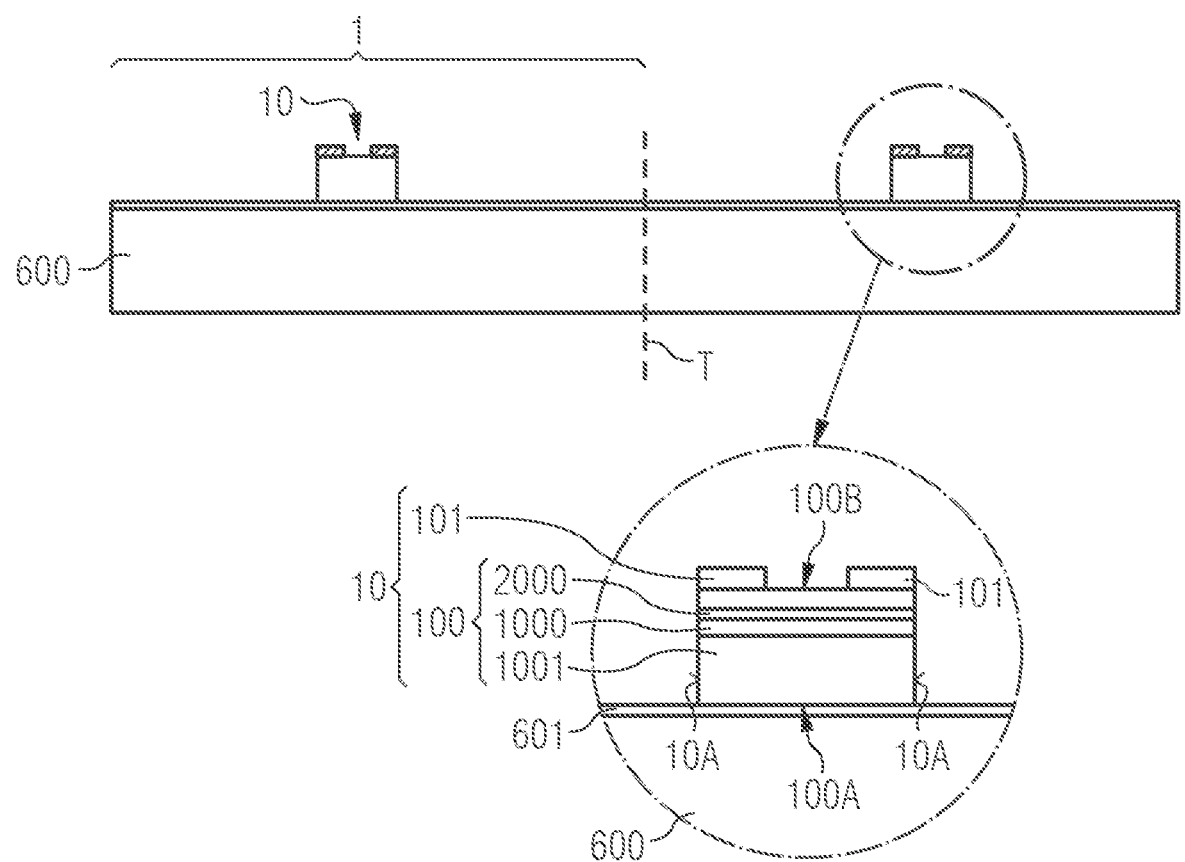

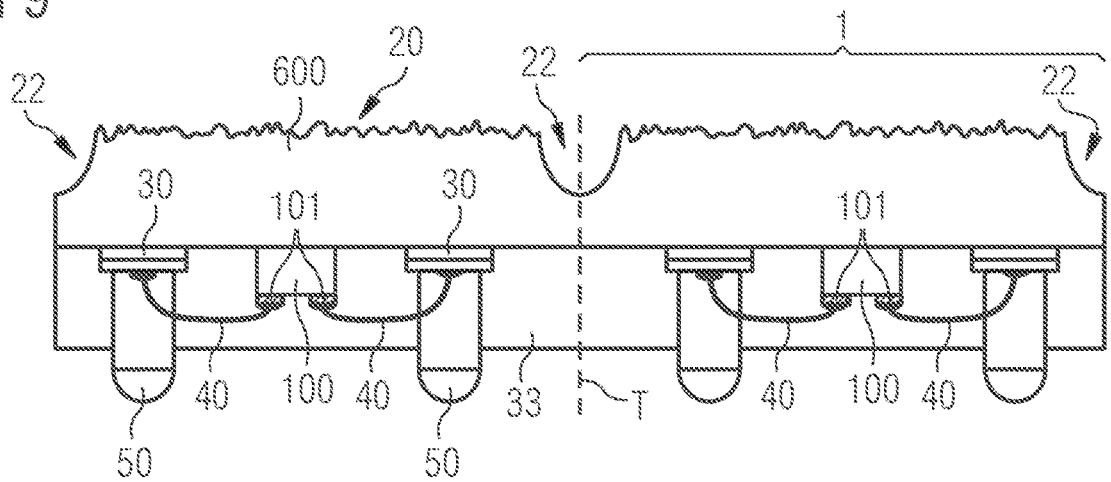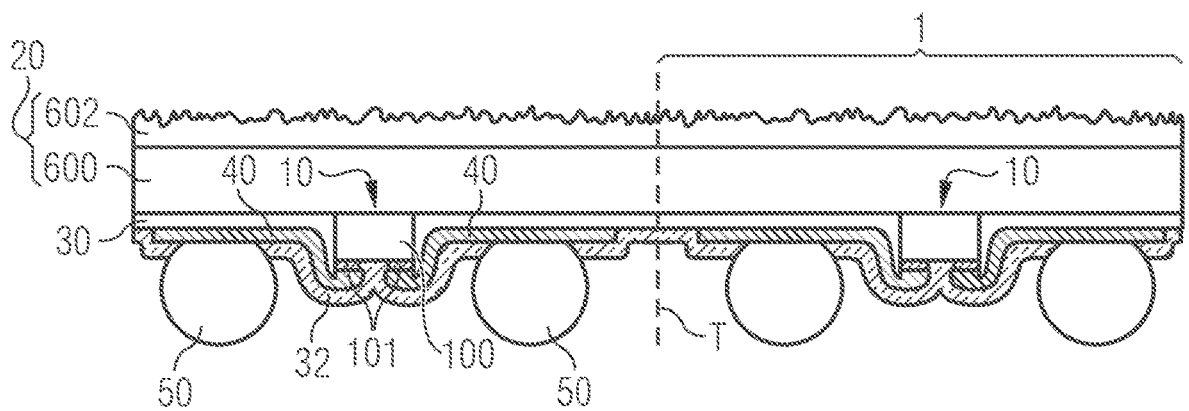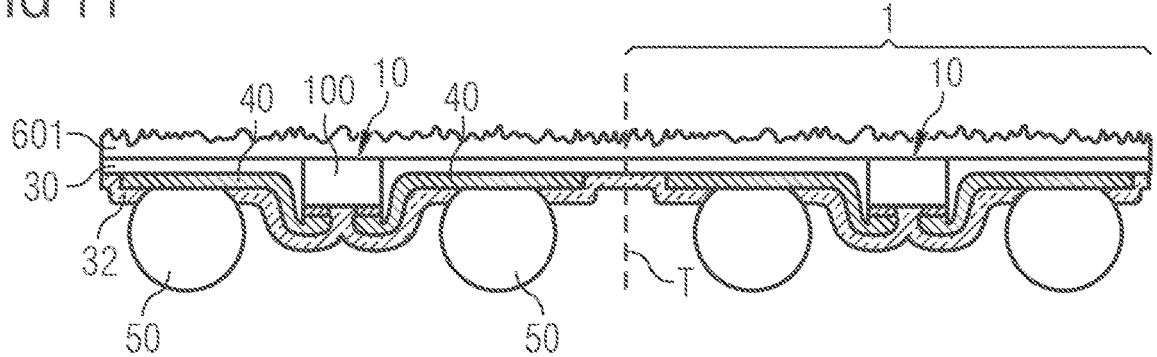

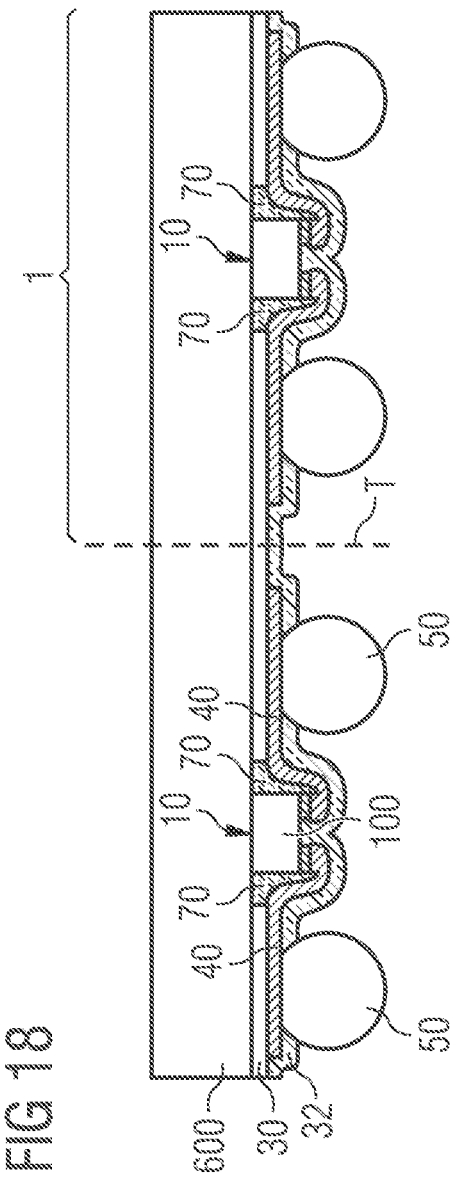

ARRANGEMENT HAVING SEMICONDUCTOR COMPONENTS THAT EMIT ELECTROMAGNETIC RADIATION AND PRODUCTION METHOD THEREFOR

This patent application is a national phase filing under section 371 of PCT/EP2020/064731, filed May 27, 2020, which claims the priority of German patent application 102019114315.2, filed May 28, 2019, each of which is incorporated herein by reference in its entirety.

TECHNICAL FIELD

An arrangement and a method for producing an arrangement are specified. The arrangement comprises a plurality of optoelectronic semiconductor components.

SUMMARY

Embodiments provide an arrangement that enables simplified assembly of optoelectronic semiconductor components.

Further embodiments provide a method for producing an arrangement that enables simplified production.

The arrangement is in particular an arrangement of optoelectronic semiconductor components which emit electromagnetic radiation, for example light, during operation.

According to at least one embodiment of the arrangement, the arrangement comprises a plurality of optoelectronic semiconductor components. The optoelectronic semiconductor components each comprise a semiconductor body, with an active region arranged to emit electromagnetic radiation. The active region preferably comprises a pn junction, a double heterostructure, a single quantum well (SQW) structure, or a multi-quantum well (MQW) structure for radiation generation.

In different semiconductor components, the active regions may each be configured to emit electromagnetic radiation with a different wavelength. For example, a first semiconductor component is configured to emit electromagnetic radiation in a red spectral range, a second semiconductor component is configured to emit electromagnetic radiation in a green spectral range, and a third semiconductor component is configured to emit electromagnetic radiation in a blue spectral range. Such an arrangement is, for example, a pixel of a display unit and can emit mixed radiation in any color that is within a color space spanned by the three semiconductor components. For example, the semiconductor components are flip chips. Flip chips are characterized inter alia by comprising a radiation exit surface free of contact structures.

Furthermore, the semiconductor components each comprise a radiation outlet side for coupling out the electromagnetic radiation and a rear face opposite the radiation outlet side. A contact structure is arranged on the rear face of the semiconductor body. The contact structure is formed with an electrically conductive material, in particular a metal. By means of the contact structure, the semiconductor component is electrically contacted and supplied with a current necessary for operation. Due to the arrangement of the contact structure on the rear face, the coupling-out of electromagnetic radiation on the radiation outlet side is not impeded. The radiation outlet side is advantageously free of contact structures.

The semiconductor components are preferably arranged in a common plane and are each laterally delimited by side faces. The side faces extend over the semiconductor body and the contact structures. The lateral extent of the semiconductor components is typically in a region of 10 μm to 200 μm and is, for example, 90 m×130 μm.

According to at least one embodiment of the arrangement, the arrangement comprises an insulation layer arranged between side faces of adjacent semiconductor components. The insulation layer is designed to be electrically insulating. For example, the insulation layer is formed with a dielectric. The insulation layer is designed to be absorbing or reflecting for radiation generated in the active region. In particular, the insulation layer is designed to be absorbent or reflective for visible electromagnetic radiation. The insulation layer comprises a thickness in the region of 0.5 μm to 150 μm, inclusive. For example, the insulation layer is a layer that comprises absorption over only a portion of the visible spectrum, thereby creating a colored impression for an observer. For example, the insulation layer primarily absorbs radiation in the blue and green spectral ranges and thus evokes a red color impression for an observer. In particular, the insulation layer comprises a structuring or pattern in its lateral extension, for example to represent a manufacturer's logo.

According to at least one embodiment of the arrangement, the arrangement comprises an output element arranged at the radiation outlet side of the semiconductor components. In particular, the output element is designed to be permeable for the electromagnetic radiation generated in the active region. The output element preferably comprises a structuring for improved coupling out of radiation.

According to at least one embodiment of the arrangement, the arrangement comprises an electrical connection structure which is arranged on the side of the semiconductor components facing the rear face and is electrically conductively connected with the contact structure. The electrical connection structure is configured in particular for making electrical contact with the optoelectronic semiconductor component.

According to at least one embodiment of the arrangement, the arrangement comprises a plurality of optoelectronic semiconductor components, an output element, an electrically insulating insulation layer and an electrical connection structure, wherein the semiconductor components are arranged in a common plane and are each laterally delimited by side faces,
the semiconductor components each comprise
a semiconductor body, with an active region configured for emission of electromagnetic radiation,
a radiation outlet side for coupling out the electromagnetic radiation,
a rear face opposite to the radiation outlet side, and
a contact structure arranged on the rear face,
the insulation layer is arranged between side faces of adjacent semiconductor components and is made absorbing or reflecting for the radiation generated in the active region,
the output element is arranged at the radiation outlet side of the semiconductor bodies, and
the electrical connection structure is arranged on the side of the semiconductor components facing the rear face and is electrically conductively connected with the contact structure.

An arrangement described herein is based on the following considerations, inter alia: for the manufacture of visual display apparatuses comprising a plurality of arrangements and requiring the highest possible density of the arrangements, it is advantageous to use arrangements having the smallest possible lateral extent. The physical arrangement and electrical contacting of a plurality of arrangements, each with a plurality of optoelectronic semiconductor components, can present difficulties when using semiconductor components with a small lateral extent. The small edge lengths of the semiconductor components make assembly, by means of a bonding process for example, difficult due to the high placement accuracy required. Furthermore, it is desirable to mount the semiconductor components on a mounting surface with as little tilt as possible relative to the mounting surface. In this way, the most uniform possible radiation behavior of all optoelectronic semiconductor components can be achieved.

The arrangement described here makes use, inter alia, of the idea of mounting a plurality of semiconductor components, which can be contacted from a rear face and comprise a radiation outlet side free of contacts, each with their radiation outlet side on a carrier. Subsequently, the contact structures of the semiconductor components arranged on the rear faces can be electrically conductively contacted by means of a connection structure. The use of connection structures enables simple contacting of semiconductor components with a small lateral extension. An assembly with the lowest possible tilt can be achieved, for example, by using spherical connection bodies formed with a solder material.

According to at least one embodiment of the arrangement, the semiconductor body comprises a semiconductor layer sequence and a radiation permeable substrate. The active region is arranged within the semiconductor layer sequence. The substrate is arranged on the side of the semiconductor layer sequence opposite the contact structures. For example, the substrate is formed with sapphire. Sapphire is advantageously permeable to electromagnetic radiation in the visible spectral range. The substrate forms the radiation exit surface of the semiconductor component. The semiconductor layer sequence is in particular epitaxially grown on the substrate. Sapphire is particularly suitable as a growth substrate of radiation-emitting semiconductor layer sequences, preferably semiconductor layer sequences based on a nitride compound semiconductor material.

According to at least one embodiment of the arrangement, the output element is formed with a glass substrate. The glass substrate comprises a thickness between 0.03 mm and 3 mm, inclusive. The glass substrate contributes in particular to the mechanical stabilization of the arrangement. The glass substrate is designed to be radiation permeable, in particular transparent or translucent to radiation generated in the active region.

Going further, the output element can also be formed with other radiation permeable materials. For example, the output element may be formed with a polymer, in particular with epoxy, acrylate, polyethylene terephthalate (PET) or a silicone, a radiation permeable ceramic or a polysiloxane.

According to at least one embodiment of the arrangement, the output element comprises, on its side facing away from the semiconductor bodies, a structuring for coupling out the electromagnetic radiation generated in the active regions. Such a structuring can be produced, for example, by means of sandblasting or using hydrofluoric acid in an etching process.

According to at least one embodiment of the arrangement, the output element is formed in its lateral extent from a sequence of radiation permeable regions and absorbing regions. In each case, a radiation permeable region is associated with an optoelectronic semiconductor component. With other words, a radiation permeable region is preferably aligned with a semiconductor component. Such a composed output element is in particular formed with plastic. The alignment of the radiation permeable regions with the semiconductor components enables unobstructed emission of electromagnetic radiation from the semiconductor components. An absorbing region is arranged circumferentially around each edge of an arrangement. The absorbing regions thus reduce or avoid visual crosstalk from adjacent arrangements. Reduced visual crosstalk can improve the contrast between adjacent arrangements.

According to at least one embodiment of the arrangement, a second radiation permeable region is introduced into the radiation permeable region with a refractive index different from the radiation permeable region. For example, the second radiation permeable region acts as a lens. In particular, the second radiation permeable region reduces the divergence of electromagnetic radiation exiting the optoelectronic semiconductor component. Each of the second radiation permeable regions is aligned with a respective optoelectronic semiconductor component in the lateral direction.

According to at least one embodiment of the arrangement, the insulation layer completely covers the output element between the side faces of the semiconductor components. In other words, the insulation layer extends in a lateral direction from a side face of one semiconductor component to a side face of another semiconductor component. With the exception of the radiation outlet sides of the semiconductor components, the insulation layer can be adapted to be continuous. In particular, the insulation layer is designed to absorb electromagnetic radiation in the visible spectral range. Thus, disturbing reflections of ambient light at the arrangement can be reduced advantageously.

According to at least one embodiment of the arrangement, the insulation layer completely covers the side faces of the semiconductor components. The insulation layer can advantageously reduce lateral radiation emission from the semiconductor component. An optoelectronic semiconductor component formed as a volume emitter can thus emulate the radiation characteristics of a surface emitter without shadowing in the optical path. Advantageously, a similar spatial radiation behavior of semiconductor components intended to emit electromagnetic radiation in different spectral ranges can result. A similar spatial radiation behavior can advantageously lead to a uniform color impression for an observer, from different viewing angles. Furthermore, in particular, a black impression is also increased when the arrangement is viewed from the side, as well as the contrast between adjacent arrangements. Further advantageously, by means of the arrangement of the insulation layer on the side faces, the brightness of the semiconductor component can be adjusted. For example, the brightness can thus be adjusted such that the operating current of the optoelectronic semiconductor component can be selected to be greater than 0.5 mA. Typical driver circuits for semiconductor components output operating currents in the region of 0.5 mA. Thus, electrical driving of the arrangement is advantageously facilitated.

According to at least one embodiment of the arrangement, the side faces of the semiconductor components are provided with a reflective coating or a cavity with reflective interfaces is formed between the insulation layer and the side faces. The reflective coating is formed, for example, with a metal, in particular Ag or Al, or a silicone, epoxy or acrylate filled with titanium dioxide particles. The cavity with reflective interfaces is preferably formed with a material having a refractive index lower than the refractive index of the material surrounding it. For example, the recess is filled with MgF or air. At the interfaces of the cavity, there is a jump in the course of the refractive indices, which can cause reflection of electromagnetic radiation. Compared to the absorption of the lateral radiation emission, a reflection of the lateral radiation emission of the optoelectronic semiconductor components leads to an advantageously increased efficiency. The radiation exiting the side faces is at least partially reflected back into the semiconductor component and can thus be coupled out through the radiation outlet side of the semiconductor component.

According to at least one embodiment of the arrangement, the thickness of the insulation layer corresponds to the thickness of the semiconductor components. The thickness of the semiconductor components and the insulation layer respectively corresponds to their dimension transverse, respectively perpendicular to their respective main extension direction. The thickness of the semiconductor components is composed in each case of the thickness of the semiconductor body and the thickness of the contact structures. If the thicknesses of the insulation layer and the semiconductor components are the same, the insulation layer serves to planarize the arrangement and enables easy further contacting of the arrangement. In order to match the thicknesses of the insulation layer and the semiconductor component, for example, an insulation layer can be used that is specifically adapted to be particularly thick. A particularly thick insulation layer is applied in particular by means of Dam&Fill or FAM (Film Assisted Transfer Molding). Accordingly, to adjust the thicknesses of the insulation layer and the semiconductor component, the thickness of the semiconductor component can also be reduced. For example, by using horizontal μLEDs whose thickness is only between 3 μm to 30 μm.

According to at least one embodiment of the arrangement, the semiconductor components are arranged at least partially in recesses of the output element. The arrangement of the semiconductor components in cavities can advantageously result in an already planar surface on the side of the output element facing the rear face of the semiconductor components. A planar surface enables easier contacting of the optoelectronic semiconductor components. For example, the recesses are fabricated using an etching process. The surfaces, shapes and depths of the recesses are preferably the same within an arrangement.

According to at least one embodiment of the arrangement, the electrical connection structure comprises, on the side facing the contact structure, an adhesive layer formed with one of the following materials: Ti, Cr, Ni, Pd. The adhesive layer can serve as an adhesion mediator layer between the contact structures and the connection structure. In particular, the thickness of the adhesive layer is in the region of 0.5 μm to 5 μm. The adhesive layer is applied to the contact structures by means of sputtering, for example.

According to at least one embodiment of the arrangement, the electrical connection structure is applied to the insulation layer as an electrically conductive layer. The connection structure is electrically conductively connected to the contact structure and is configured to supply the optoelectronic semiconductor components with a current necessary for operation. In particular, the connection structure is applied to the insulation layer in a form-fit manner. For example, the connection structure is applied to the insulation layer as a film. Preferably, the connection structure comprises a thickness in the region of 5 μm to 20 μm. The width of the connection structure is advantageously between 30 μm and 60 μm. The connection structure is applied to the insulation layer by means of electrodeposition, for example. An adhesive or solder material can thus advantageously be dispensed with to produce an electrically conductive connection between the contact structure and the connection structure. With other words, there is in particular no adhesive material or solder material between the contact structure and the connection structure.

According to at least one embodiment of the arrangement, the electrical connection structure is electrically conductively connected with a connection body, which preferably forms a ball grid array (BGA) or a land grid array (LGA).

A BGA is formed with spherical bodies comprising a solder material. In particular, the solder ball comprises a diameter between 50 μm to 200 μm and preferably of 180 μm. A BGA formed with solder balls is used for electrical contacting of a semiconductor component and in particular as a spacer between the semiconductor component and a circuit board on which the semiconductor component is mounted. This avoids direct physical contact of the semiconductor component with the underlying circuit board. Mounting using a BGA can advantageously cushion a differential thermal expansion coefficient between a mounting substrate and the semiconductor component. Solder ball application can be accomplished by solder ball jetting or gang ball placement, for example. Alternatively, a solder paste can be printed on, which subsequently forms solder balls by heating.

An LGA can be formed with connection bodies that comprise a flat, pillow-shaped extension. For example, the connection bodies for an LGA are formed with solder material. Flat connection bodies are advantageously combined with a planar surface, as they allow little or no clearance between a mounting carrier and the semiconductor component. Mounting is thus advantageously performed with a particularly small deviation from a parallel position to the mounting substrate.

According to at least one embodiment of the arrangement, a second insulation layer is arranged on the side of the arrangement facing away from the output element and serves to mechanically stabilize the arrangement. For example, the second insulation layer is formed with an epoxy or a silicone. The second insulation layer comprises in particular a thickness of at least 50 μm and serves to mechanically stabilize the arrangement. The second insulation layer can be applied to the arrangement, for example, by means of Dam&Fill, by molding or by lamination.

According to at least one embodiment of the arrangement, the output element comprises a peripherally extending trench. A circumferential trench can be produced, for example, by sawing, etching or by glass molding. The peripherally extending trench reduces the visual crosstalk of adjacent arrangements and thus advantageously increases the visual contrast between adjacent arrangements. Furthermore, the trench can be filled with an absorbing material, for example by means of jetting, dispensing or printing. Filling the trench with an absorbing material can further reduce crosstalk between adjacent arrangements. The trench may be arranged on the side facing away from the semiconductor component or on the side facing the semiconductor component. The trench extends in the output element and preferably does not completely penetrate the output element.

A method for producing an arrangement is further specified. In particular, the arrangement can be produced by means of a method described herein. That is, all features disclosed in connection with the method for producing an arrangement are also disclosed for the arrangement, and vice versa.

According to at least one embodiment of the method for producing an arrangement, providing a carrier and a radiation permeable joining layer is performed on a first side of the carrier. For example, the carrier is formed with a mechanically stable material and preferably comprises a planar surface on the first side. The radiation permeable joining layer is preferably formed with an acrylate, an epoxy, a silicone, or a hybrid material. The joining layer is preferably uniformly thick over its entire lateral extent and comprises little or no meniscus formation on the side faces of semiconductor components.

The joining layer is applied, for example, by spin coating, spraying, slit coating, jetting, stamping, printing or dispensing. The joining layer is applied in particular over the entire surface of the first region of the carrier or preferably only in the regions on the first region of the carrier selected later for mounting semiconductor components. When using silicones as material for the joining layer, it is advantageous to apply the joining layer only in the regions later selected for mounting semiconductor components in order to avoid an anti-adhesive effect of the silicone material.

According to at least one embodiment of the method for producing an arrangement, a plurality of optoelectronic semiconductor components is provided, wherein the semiconductor components are each laterally delimited by a side face. The semiconductor components each comprise a semiconductor body with an active region arranged for emission of electromagnetic radiation, a radiation outlet side for coupling out the electromagnetic radiation, a rear face opposite the radiation outlet side, and a contact structure arranged on the rear face. Furthermore, the semiconductor components are applied to the joining layer with their respective radiation outlet sides.

According to at least one embodiment of the method for producing an arrangement, arranging an electrically insulating insulation layer on the first side of the carrier is performed. The insulation layer may be applied, for example, by means of Dam&Fill or FAM.

According to at least one embodiment of the method for producing an arrangement, the contact structures are exposed. The contact structures, which are covered by the insulation layer, are exposed by means of a structuring process to enable electrical contacting.

According to at least one embodiment of the method for producing an arrangement, the arrangement of a connection structure takes place on the side of the semiconductor components facing the rear face. The arrangement of the connection structure serves to make electrical contact with the contact structures and consequently to supply the optoelectronic semiconductor components with an operating current. The arrangement of the connection structure is preferably carried out by means of a planar interconnect method. In the planar interconnect method, an adhesive layer formed with Ti, Cr, Ni or Pd is first applied to the contact structures by means of sputtering. Subsequently, a growth layer is applied to the adhesive layer by means of sputtering, which is formed with Cu, for example. In a further step, a connection layer formed with Cu can be electrodeposited on the growth layer. A connection structure formed by means of the planar interconnect method preferably comprises an adhesive layer, a growth layer and a connection layer.

According to at least one embodiment of the method for producing an arrangement, the carrier is formed with a radiation permeable material and thus forms an output element together with the joining layer. The output element serves to couple out electromagnetic radiation generated in the optoelectronic semiconductor component. Preferably, the carrier comprises a structuring on its side facing away from the semiconductor component for coupling out the radiation. Such a structuring can be produced, for example, by means of sandblasting or an etching process using hydrofluoric acid.

According to at least one embodiment of the method for producing an arrangement, the carrier is detached and the joining layer forms the output element. Consequently, the requirements for the radiation permeability of the carrier are advantageously reduced, since the carrier is detached before the semiconductor component is completed. Consequently, the carrier may also be formed with a material that is opaque to radiation. The joining layer is preferably formed with a radiation permeable material comprising a patterning for coupling out electromagnetic radiation.

According to at least one embodiment of the method for producing an arrangement, the carrier comprises a structuring on its side facing the joining layer, which structuring is imprinted in the joining layer. The carrier leaves a negative form of its structuring in the joining layer. Thus, for example, a joining layer can be structured by the structuring of the carrier itself. When the carrier is subsequently detached from the joining layer, this ensures a remaining patterning for coupling out radiation on the joining layer. Advantageously, the joining layer can be used as a patterned output element.

According to at least one embodiment of the arrangement, a protective layer is arranged on the side of the connection structures facing away from the insulation layer. The protective layer can protect the underlying layers from external environmental influences. Advantageously, the protection of the connection structures from moisture reduces the risk of metal-ion migration and thus the risk of a short circuit. In particular, the protective layer does not completely cover the connection structures. Preferably, the protective layer comprises a solder stop effect. For example, the protective layer serves to laterally delimit the connection bodies at the points of the connection structure that are uncovered by the protective layer.

According to at least one embodiment of the arrangement, a reflection layer is arranged between the output element and the insulation layer. The reflection layer is preferably formed with a metal. By means of the reflection layer, the appearance of the arrangement can be adjusted in an off-state in which the semiconductor components are not in operation. For example, the arrangement can be perceived as a reflective surface when the reflection layer is formed with Ag. The reflection layer may also be formed with a metal oxide, for example, to provide a semi-transparent mirror surface.

According to at least one embodiment of the arrangement, an output coupling layer is arranged on the radiation outlet side. Preferably, the output coupling layer is adapted with a radiation permeable material comprising a patterning for coupling out radiation. For example, the output coupling layer is applied to the radiation outlet side and/or the insulation layer by means of spray coating, imprinting or laminating.

According to at least one embodiment of the arrangement, the output element comprises a plurality of scattering centers introduced into the output element by means of internal glass engraving. Advantageously, the scattering centers can homogenize the coupling out of electromagnetic radiation. Preferably, a selective arrangement of scattering centers reduces crosstalk between adjacent arrangements.

According to at least one embodiment of the arrangement, a release layer is arranged between the insulation layer and the output element. The release layer is formed, for example, with a polymer. Under the action of electromagnetic radiation and/or the action of an elevated temperature, the release layer enables a simplified detachment of the output element from the insulation layer.

According to at least one embodiment, a connection body comprises a core and a shell. The core is formed with a material that comprises a higher melting point than the material of the shell. For example, a core formed with Cu or Ni is surrounded by a shell made of a solder material. The shell preferably completely encloses the core. In this way, a connection body can advantageously be formed which comprises a defined diameter after melting of the shell. The distance between a semiconductor component and a mounting carrier thus corresponds at least to the diameter of the core. A connection body configured in this way further comprises an increased stability against crack formation.

The subject matter of the present application also relates to a plurality of arrangements, such as a module comprising a plurality of arrangements. The plurality of arrangements in a module may be formed with arrangements that comprise the same features, but may also be formed with arrangements that comprise different features, as described herein. Features are understood to include all features of arrangements described in the context of the present application.

BRIEF DESCRIPTION OF THE DRAWINGS

Further advantages and advantageous embodiments and further embodiments of the arrangement are apparent from the following exemplary embodiments shown in connection with the figures.

FIGS. 1A and 1B show a schematic top view (FIG. 1A), and a sectional view (FIG. 1B) of a plurality of arrangements described herein according to a first exemplary embodiment;

FIGS. 2A to 2F show schematic sectional views of a plurality of arrangements described herein and an enlarged section of an arrangement (FIGS. 2B and 2D), according to a second exemplary embodiment, in different stages of a method for producing them;

FIG. 9 shows a schematic sectional view of a plurality of arrangements described herein according to a ninth exemplary embodiment;

FIG. 10 shows a schematic sectional view of a plurality of arrangements described herein according to a tenth exemplary embodiment;

FIG. 11 shows a schematic sectional view of a plurality of arrangements described herein according to an eleventh exemplary embodiment;

FIG. 18 shows a schematic sectional view of a plurality of arrangements described herein according to an eighteenth exemplary embodiment;

FIG. 19 shows a schematic sectional view of a plurality of arrangements described herein according to a nineteenth exemplary embodiment;

Identical, similar, or similar-acting elements are indicated in the figures with the same reference numerals. The figures and the proportions of the elements shown in the figures with respect to each other are not to be considered as to scale.

Figure 2C:
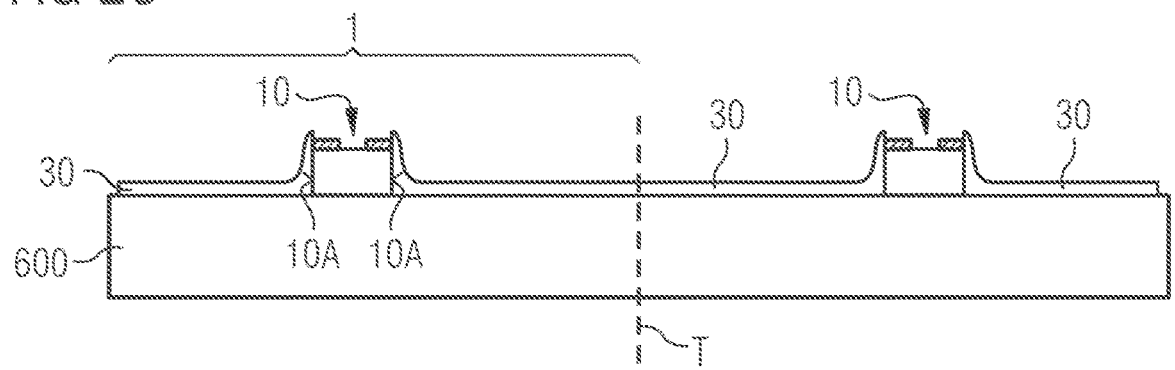

Rather, individual elements may be shown exaggeratedly large for better representability and/or for better comprehensibility.

DETAILED DESCRIPTION OF ILLUSTRATIVE EMBODIMENTS

FIG. 1A shows a schematic top view of a plurality of arrangements 1 described herein according to a first exemplary embodiment. Each arrangement 1 extends to a parting line marked with T. The parting line T delimits an arrangement 1 in its lateral extent. A separation of a plurality of arrangements 1 takes place, for example, along the parting line T. An arrangement 1 comprises in each case a plurality of optoelectronic semiconductor components 10 with connection structures 40. The connection structures 40 of a semiconductor component 10 are in each case electrically conductively connected with connection bodies 50. By means of the connection bodies 50, for example, the arrangement 1 can be easily mounted on a printed circuit board. Each of the arrangements 1 comprises a connection body 50 which does not comprise an electrical connection to any of the connection structures 40. With other words, each of the arrangements 1 comprises at least one connection body 50 which is not electrically contacted. This non-electrically contacted connection body 50 may serve to provide mechanical stabilization when the arrangement 1 is mounted on a printed circuit board.

The optoelectronic semiconductor components 10 are each laterally spaced from one another, arranged in a common plane and configured to emit electromagnetic radiation. Each optoelectronic semiconductor component 10 is configured to emit electromagnetic radiation with a different wavelength. For example, the optoelectronic semiconductor components 10 are each configured to emit light in a red, green, or blue spectral range. Each arrangement 1 represents, for example, a pixel of a visual display apparatus, or display. In particular, each of the arrangements 1 serves as a pixel of a video wall. In particular, the semiconductor components 10 are flip chips comprising semiconductor layer sequences 1000 grown on a substrate 1001 formed with sapphire.

FIG. 1B shows a sectional view of a plurality of arrangements 1 described herein according to the first exemplary embodiment. The sectional view corresponds to a section along a cut line Z of the schematic top view of arrangements 1 described herein shown in FIG. 1A. Each arrangement 1 comprises an optoelectronic semiconductor component 10 comprising a semiconductor body 100 and a plurality of contact structures 101. The semiconductor body 100 includes a radiation outlet side 100A provided for coupling out electromagnetic radiation and a rear face 100B opposite to the radiation outlet side 100A. The semiconductor component 10 is delimited in its lateral extent by a side face 10A. The contact structures 101 are located on the rear face 100B of the semiconductor component 10. The contact structures 101 are each electrically conductively connected with the connection structures 40.

The semiconductor component 10 is applied with the radiation outlet side 100A to a carrier 600. An electrically insulating insulation layer 30 is applied to the carrier 600 and extends between the side faces 10A of the semiconductor components 10. The insulation layer 30 is made absorbent to electromagnetic radiation generated in the semiconductor component 10. Consequently, the insulation layer 30 gives a dark or black impression to an observer. Disturbing reflections of ambient light can thus be advantageously reduced.

The connection structures 40 are arranged on the insulation layer 30 and electrically conductively connected with the connection bodies 50. Consequently, each semiconductor component 10 is supplied with an operating current by means of the connection structures 40. The connection structures 40 are manufactured by means of a planar interconnect method and applied to the insulation layer 30. The planar interconnect method is similar to a redistribution layer (RDL) method. The connection structures 40 are formed with Cu. The width of the connection structures 40 is between 30 μm and 60 μm.

FIGS. 2A to 2F show schematic sectional views of a plurality of arrangements 1 described herein, and an enlarged section of an arrangement 1 according to a second exemplary embodiment. The sectional views shown herein are taken at various stages of a method for producing the arrangements 1.

FIG. 2A shows the provision of a carrier 600. The carrier 600 is formed with a radiation permeable material. The thickness of the carrier 600 is 250 μm.

FIG. 2B shows a schematic sectional view of a plurality of arrangements 1 in a further step of a method for producing them, as well as an enlarged section of an arrangement 1. The elements shown in the enlarged section may be partially avoided in the further figures for better clarity.

In the enlarged section, the structure of the optoelectronic semiconductor component 10 is shown. The optoelectronic semiconductor component 10 comprises contact structures 101 and a semiconductor body 100. The semiconductor body 100 comprises a substrate 1001 and a semiconductor layer sequence 1000. The semiconductor layer sequence 1000 is grown on the substrate 1001. An active region 2000 is arranged in the semiconductor layer sequence 1000, which is configured to emit electromagnetic radiation. The semiconductor body 100 comprises a radiation outlet side 100A and a rear face 100B opposite to the radiation outlet side 100A. The contact structures 101 are arranged on the rear face 100B of the semiconductor body 100. Consequently, unobstructed emission of electromagnetic radiation generated in the active region 2000 during operation is possible on the radiation outlet side 100A opposite to the rear face 100B. The optoelectronic semiconductor component 10 comprises side faces 10A laterally delimiting the optoelectronic semiconductor component 10. The side faces 10A extend from the contact structures 101 to the substrate 1001 of the semiconductor layer sequence 1000. The lateral dimensions of the semiconductor components 10 are typically in a region of 10 µm to 200 µm, in particular in a region of 80 µm to 150 µm and is, for example, 90 m×130 µm. The thickness of the semiconductor components 10 is 80 µm.

The semiconductor components 10 are mounted on the carrier 600 by means of a joining layer 601 with their side facing the radiation outlet side 100A. The joining layer 601 is formed with an acrylate, an epoxy, a silicone, or a hybrid material. The joining layer 601 is formed to be permeable to the electromagnetic radiation generated in the active region 2000. In particular, the joining layer 601 is made permeable, in particular transparent, to the generated radiation. The joining layer 601 is applied over the entire surface of the carrier 600. For example, the joining layer 601 is applied to the carrier 600 by means of spin coating, printing or dispensing. Alternatively, the joining layer 601 may be applied to the carrier 600 only at those locations where a semiconductor component 10 is placed.

FIG. 2C shows a schematic sectional view of a plurality of arrangements 1 described herein according to the second exemplary embodiment in a further step of a method for producing them. An optically insulating insulation layer 30 is applied to the carrier 600, extending from the side faces 10A of a semiconductor component 10 to the side face 10A of an adjacent semiconductor component 10. In other words, the insulation layer 30 completely covers the carrier 600, with the exception of the lateral extent of the semiconductor components 10. The side faces 10A of the semiconductor components 10 are also completely covered by the insulation layer 30. Advantageously, an impression of the arrangement 1 that is black to an observer can thus be formed, and undesired reflections on the arrangement 1 are reduced. The insulation layer 30 is formed with an epoxy or a silicone. In particular, the material of the insulation layer 30 is filled with particles of an absorbing material.

Figure 2D:
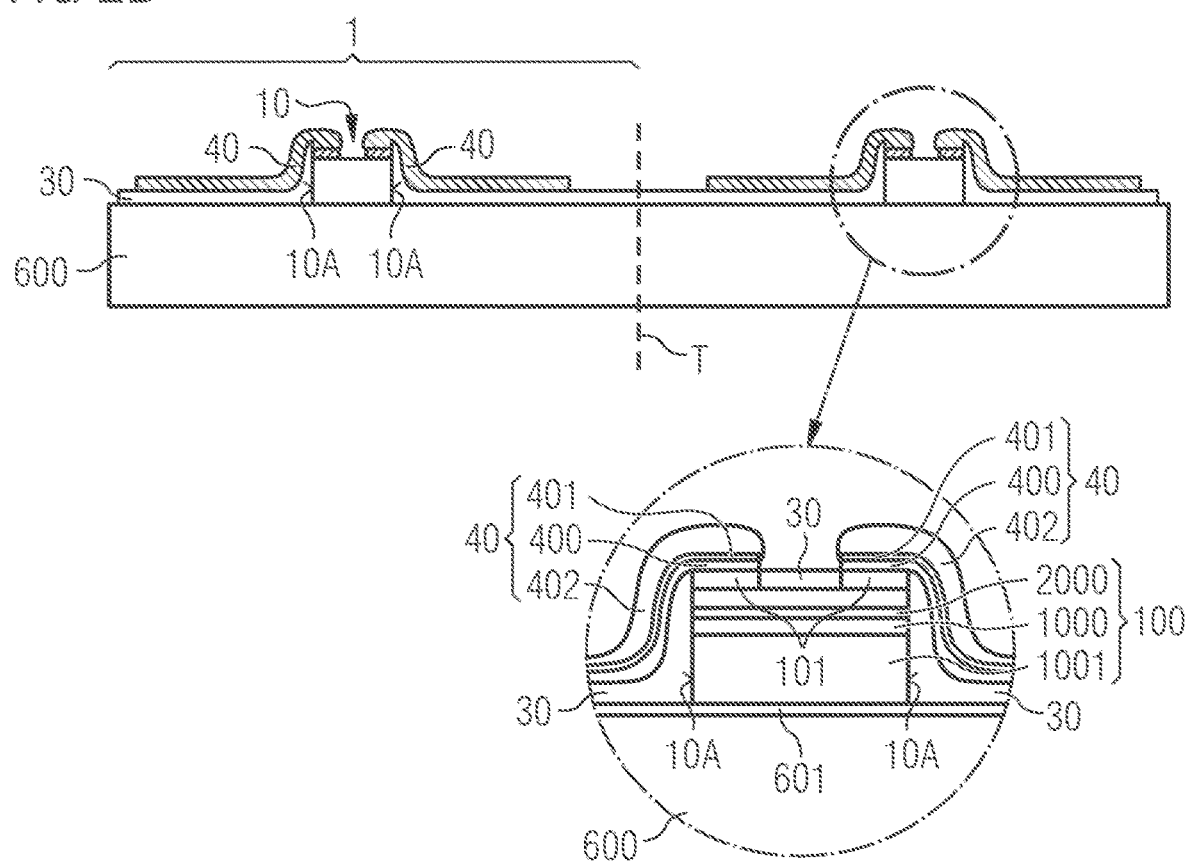

FIG. 2D shows a schematic sectional view of a plurality of arrangements 1 described herein according to the second exemplary embodiment in a further step of a method for producing them, as well as an enlarged section of an arrangement 1. Connection structures 40 are applied to the insulation layer 30. From the enlarged section of the arrangement 1, the exact layer structure of the connection structures 40 can be seen. The elements shown in the enlarged section may be partially avoided in the further figures for better clarity.

First, an adhesive layer 400 is applied to the contact structures 101, which is formed, for example, by means of palladium, nickel, chromium or titanium. The adhesive layer is preferably applied by means of sputtering. The thickness of the adhesive layer is 5 nm to 500 nm. A further growth layer 401 is applied to the adhesive layer 400, which is formed, for example, with copper. The growth layer 401 is preferably applied by means of sputtering. The thickness of the growth layer 401 is 0.5 µm to 2 µm. A connection layer 402 is applied to the growth layer 401, for example by means of electrodeposition. A connection structure 40 applied in this way can be referred to as a planar interconnect. From the enlarged section of the optoelectronic semiconductor component 10, the complete coverage of the side faces 10A of the optoelectronic semiconductor component 10 by the insulation layer 30 can also be seen. The insulation layer 30 may also be located between the contact structures 101. The insulation layer 30 may provide enhanced protection against a short circuit between the contact structures. For clarity, it may not be shown in the further figures.

Figure 2E:
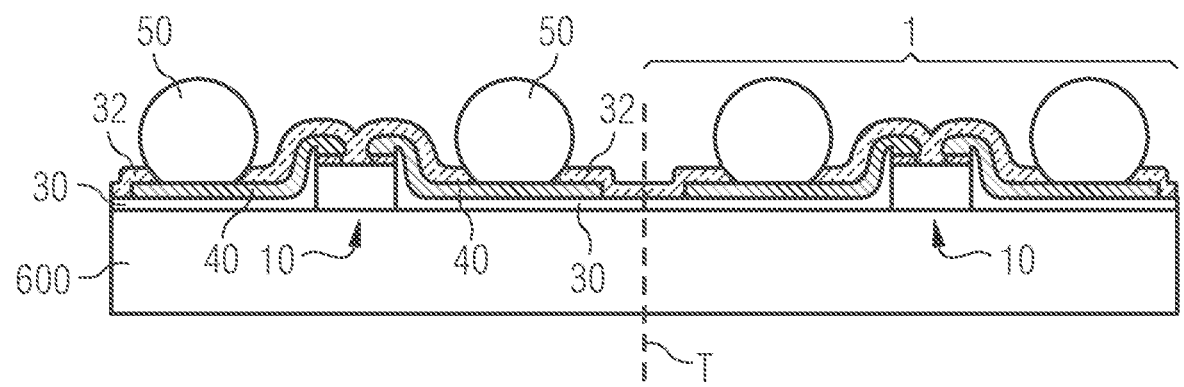

FIG. 2E shows a schematic sectional view of a plurality of arrangements 1 described herein according to the second exemplary embodiment in a further step of a method for producing them. A protective layer 32 is applied to the connection structures 40. For example, the protective layer 32 is formed with an electrically insulating material. For example, the protective layer 32 is formed with an epoxy, a silicone, or an acrylate. The protective layer 32 has a solder stopping effect, and thus can prevent an undesirable lateral spread of a liquid solder on the surface of the connection structures 40. Connection bodies 50 are arranged at the recesses of the protective layer 32. For example, the connection bodies 50 are applied in the form of solder balls and are electrically conductively connected with the connection structure 40. The connection bodies 50 comprise a diameter of 150 µm to 200 µm.

Figure 2F:
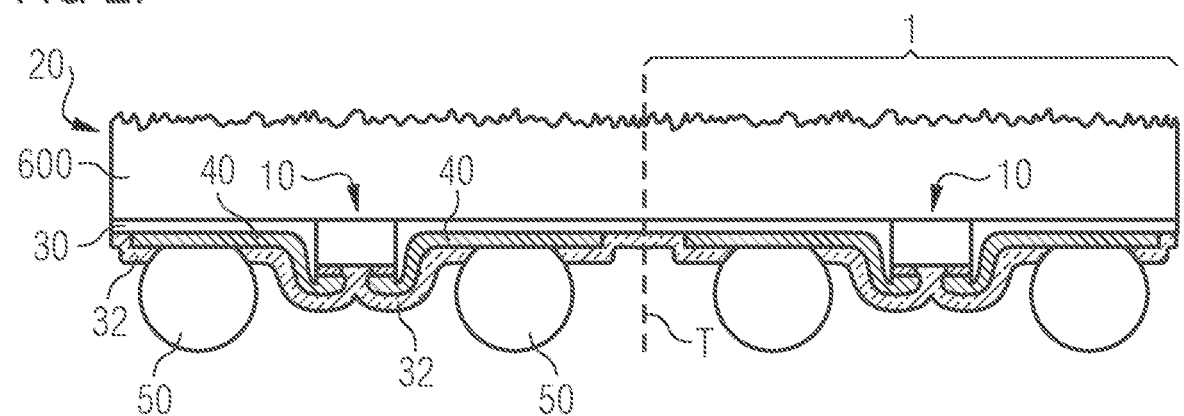

FIG. 2F shows a schematic sectional view of a plurality of arrangements 1 described herein according to the second exemplary embodiment in a further step of a method for producing them. The surface of the carrier 600 is structured on the side facing away from the optoelectronic semiconductor components 10. For example, the structuring is in the form of roughening by means of sandblasting or in an etching process with hydrofluoric acid. Such a structured surface advantageously increases the coupling out efficiency of electromagnetic radiation emitted from the optoelectronic semiconductor components 10. The carrier 600 forms an output element 20 for coupling out electromagnetic radiation from the arrangements 1.

Figure 3:
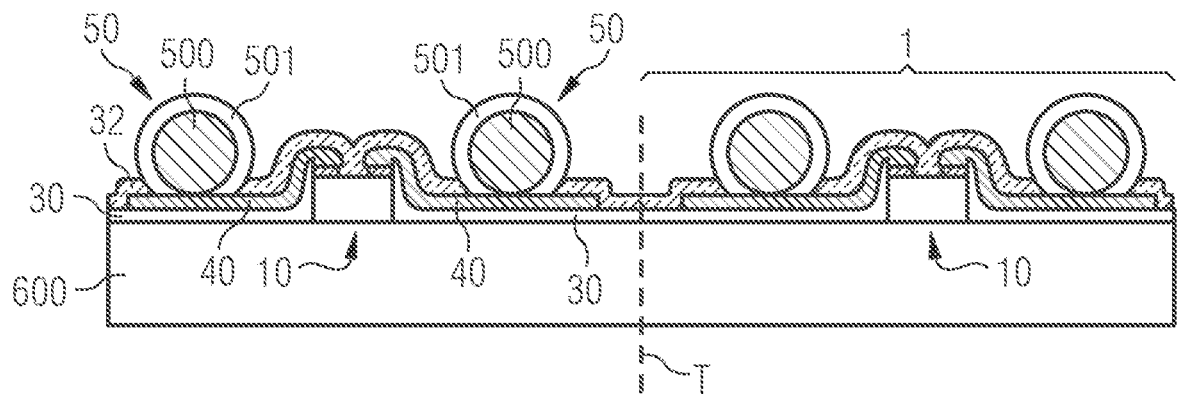
FIG. 3 shows a schematic sectional view of a plurality of arrangements described herein, according to a third exemplary embodiment.

FIG. 3 shows a schematic sectional view of a plurality of arrangements 1 described herein according to a third exemplary embodiment. The third exemplary embodiment is substantially the same as the second exemplary embodiment. In the third exemplary embodiment, the connection bodies 50 each comprise a core 500 and a shell 501.

The core 500 is formed with nickel or copper, for example. In particular, the shell 501 is formed with a solder material. The core 500 comprises a higher melting point than the surrounding material of the shell 501. Advantageously, a defined distance of the optoelectronic semiconductor component 10 from a further mounting surface can thus be ensured in a soldering process. The minimum distance corresponds to the diameter of the core 500. Further advantageously, a connection body 50 constructed in this way tends less to crack formation and thus increases the reliability of the optoelectronic semiconductor component 10.

Figure 4:
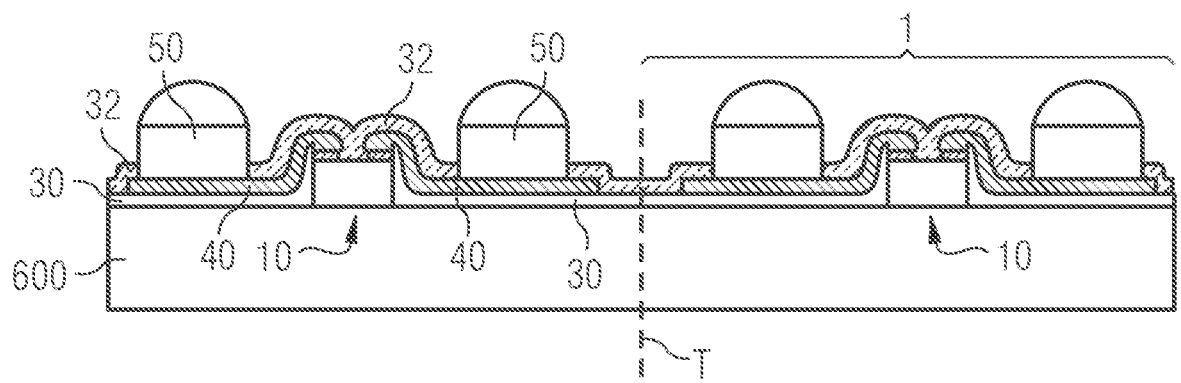
FIG. 4 shows a schematic sectional view of a plurality of arrangements described herein according to a fourth exemplary embodiment.

FIG. 4 shows a schematic sectional view of a plurality of arrangements 1 described herein according to a fourth exemplary embodiment. The fourth exemplary embodiment is substantially the same as the second exemplary embodiment.

The connection bodies 50 comprise a copper structure and a solder material applied to the copper structure. The copper structure is applied to the connection structures 40 and comprises a cylindrical shape. The axis of rotation of this cylinder is perpendicular to the main extension plane of the arrangement 1. A solder material is arranged on the side of the copper structure facing away from the connection structures 40, which solder material is provided for electrical contacting of the connection bodies 50. Advantageously, the height of the copper structure can be used to set a distance of the optoelectronic semiconductor component 10 from a subsequent mounting surface.

Figure 5:
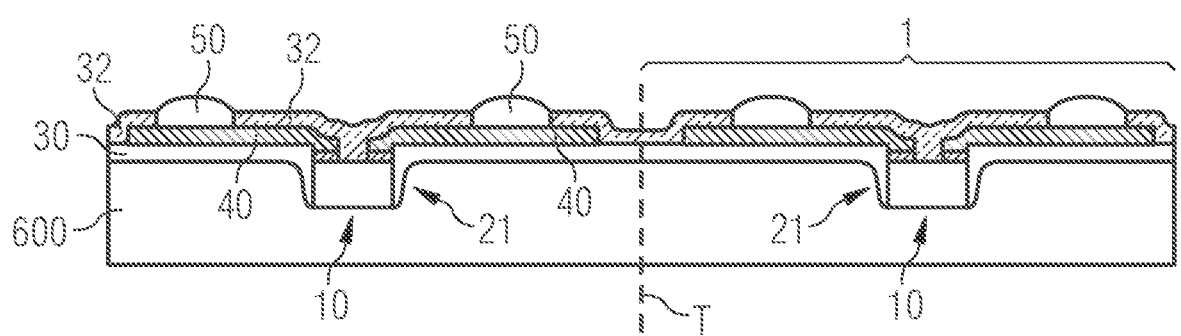
FIG. 5 shows a schematic sectional view of a plurality of arrangements described herein according to a fifth exemplary embodiment.

FIG. 5 shows a schematic sectional view of a plurality of arrangements 1 described herein according to a fifth exemplary embodiment. A carrier 600 comprises a plurality of recesses 21, into each of which both a semiconductor component 10 and a part of an insulation layer 30 are introduced. In other words, the semiconductor components 10 are each embedded in the carrier 600. For example, the carrier 600 may be formed with a glass substrate in which a plurality of cavities are etched.

A connection structure 40 is arranged on the insulation layer 30, which is electrically conductively connected with connection bodies 50. The connection bodies 50 are adapted as flat, pillow-shaped regions made of a solder material. The connection bodies 50 are limited in their lateral extent by a protective layer 32. By embedding the optoelectronic semiconductor components 10 in the carrier 600, a planar surface advantageously results on the side of the carrier 600 facing the semiconductor components 10. A planar surface advantageously facilitates further contacting by means of the connection bodies 50. A spacer is advantageously no longer required due to the already planar surface.

Figure 6:
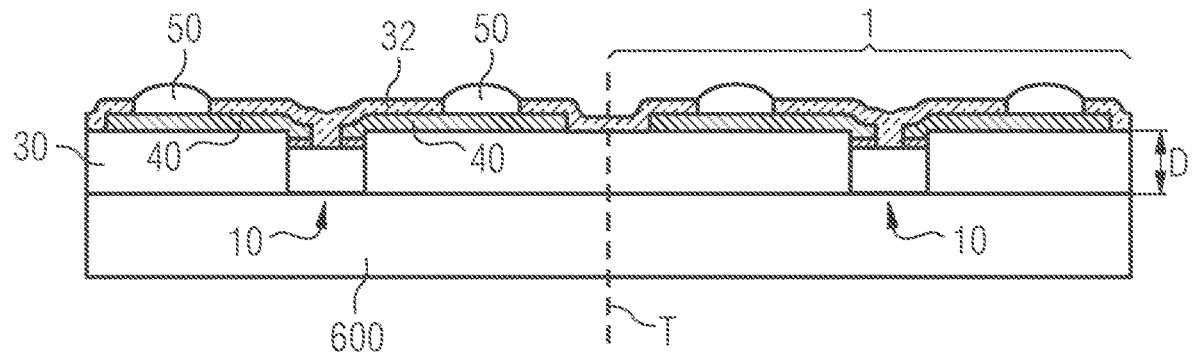
FIG. 6 shows a schematic sectional view of a plurality of arrangements described herein according to a sixth exemplary embodiment.

FIG. 6 shows a schematic sectional view of a plurality of arrangements 1 described here according to a sixth exemplary embodiment. The sixth exemplary embodiment corresponds essentially to the fifth exemplary embodiment. In the sixth exemplary embodiment shown herein, the insulation layer 30 comprises a thickness equal to the thickness of the optoelectronic semiconductor component 10, and the carrier 600 does not comprise any recesses 21. Thus, the thickness of the insulation layer D completely balances the height of the optoelectronic semiconductor component 10. This advantageously facilitates the further arrangement of connection structures 40 and connection bodies 50. The connection bodies 50 are adapted as flat, cushion-shaped solder regions.

Figure 7:
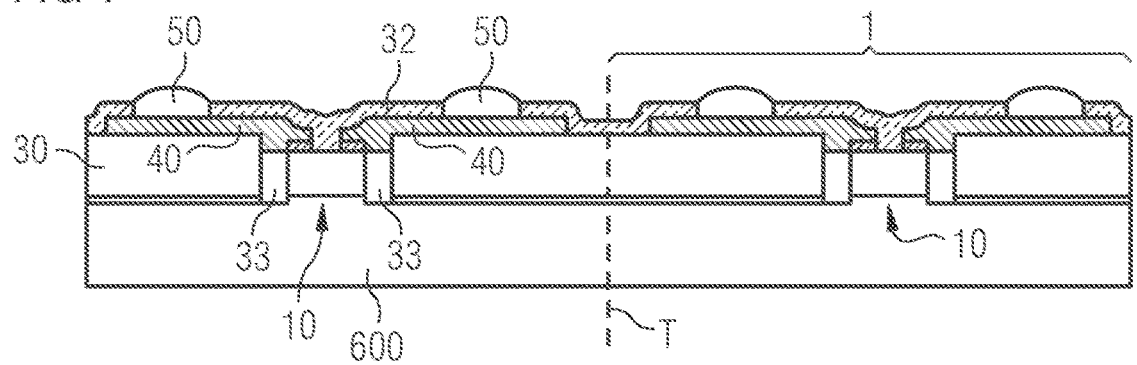
FIG. 7 shows a schematic sectional view of a plurality of arrangements described herein according to a seventh exemplary embodiment.

FIG. 7 shows a schematic sectional view of a plurality of arrangements 1 described herein in accordance with a seventh exemplary embodiment. The seventh exemplary embodiment is substantially the same as the sixth exemplary embodiment. The insulation layer 30 is applied to the carrier 600 by a lamination process. In this case, the insulation layer 30 comprises recesses in advance whose position and size, within a certain tolerance, correspond to the position and size of the optoelectronic semiconductor components 10. Any empty space remaining between the applied optoelectronic semiconductor components 10 and the insulation layer 30 due to the tolerance is filled by means of a shaped body 33. The shaped body 33 is formed with an electrically insulating material which comprises an optical absorption. The side faces 10A of the semiconductor components 10 are completely covered by the shaped body 33. Thus, lateral emission of electromagnetic radiation from the side faces 10A by the shaped body 33 is advantageously reduced or prevented.

Figure 8:
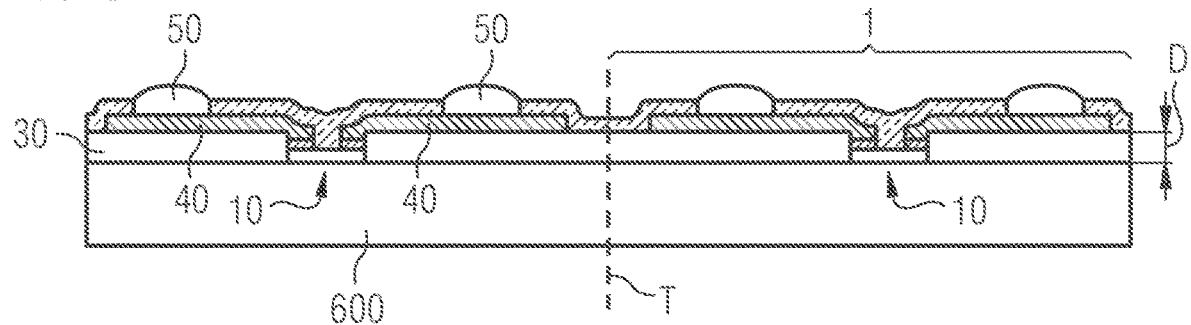
FIG. 8 shows a schematic sectional view of a plurality of arrangements described herein according to an eighth exemplary embodiment.

FIG. 8 shows a schematic sectional view of a plurality of arrangements 1 described herein according to an eighth exemplary embodiment. The eighth exemplary embodiment corresponds substantially to the sixth exemplary embodiment. In the eighth exemplary embodiment shown herein, the thickness D of the optoelectronic semiconductor components 10 is reduced such that the thickness of the insulation layer 30 in its is sufficient to fully compensate for the thickness of the optoelectronic semiconductor components 10. In other words, the thickness D of the insulation layer 30 is equal to the thickness of the semiconductor components 10. The thickness of the optoelectronic semiconductor components 10 is between 3 μm and 30 μm. The thickness of the insulation layer D thus fully compensates for the height of the optoelectronic semiconductor components 10. This advantageously facilitates the further arrangement of connection structures 40 and connection bodies 50. The connection bodies 50 are adapted as flat, cushion-shaped solder areas.

FIG. 9 shows a schematic sectional view of a plurality of arrangements 1 described herein according to a ninth exemplary embodiment. In the ninth exemplary embodiment, the contacting of optoelectronic semiconductor components 10 is carried out in each case by means of connection structures 40 in the form of a bonding wire. In particular, the connection structure 50 is designed as a ball, stich on ball reverse bond connection, since particularly low loop heights of the bonding wire are thus possible. A low loop height advantageously reduces the minimum thickness of the arrangement 1. An insulation layer 30 is applied partially to a carrier 600. Connection bodies 50 are arranged on the insulation layer 30. The connection bodies 50 comprise a copper structure and a solder material applied thereto. The copper structure comprises a cylindrical shape with its axis of rotation oriented perpendicular to the main extension plane of the arrangement 1. An under bump metallization (UBM) in the form of an ENEPIG (electroless Ni, electroless Pd, immersion gold) coating is arranged on the copper structure. The copper structures are electrically conductively connected with the contact structures 101 by means of the connection structures 40, in the form of bonding wires.

For mechanical stabilization of the connection structures 40, the side of the carrier 600 facing the semiconductor components 10 is molded with a shaped body 33. The shaped body 33 is designed to be electrically insulating and optically absorbing. For example, the shaped body 33 is formed with an epoxy or a silicone into which particles of a filling material are introduced. The carrier 600 comprises a patterning on the side facing away from the semiconductor components 10, and a peripherally extending trench 22. The trench 22 reduces a waveguide effect in the carrier 600 and reduces visual crosstalk from adjacent arrangements 1. The structuring of the carrier 600 results in improved coupling out of electromagnetic radiation from the arrangement 1.

FIG. 10 shows a schematic sectional view of a plurality of arrangements 1 described herein according to a tenth exemplary embodiment. The tenth exemplary embodiment is substantially the same as the second exemplary embodiment. In the tenth exemplary embodiment shown herein, an output coupling layer 602 is applied to the carrier 600. The output coupling layer 602 may comprise, for example, a film or another radiation permeable carrier that comprises a patterning for coupling out electromagnetic radiation. Together with the carrier 600, the output coupling layer 602 forms an output element 20.

FIG. 11 shows a schematic sectional view of a plurality of arrangements 1 described herein according to an eleventh exemplary embodiment. The eleventh exemplary embodiment of a plurality of arrangements 1 shown herein comprises a plurality of semiconductor components 10 which comprise a radiation outlet side 100A and a rear face 100 B opposite to the radiation outlet side 100A, and which are laterally delimited by side faces 10A. The side faces 10A are completely covered by an insulation layer 30, which is made to be optically absorbent. The insulation layer 30 is arranged laterally between the semiconductor components 10. Connection structures 40, a protective layer 32 and connection bodies 50 are applied to the insulation layer.

A joining layer 601 is arranged on the side of the insulation layer 30 facing away from the semiconductor components 10. For example, a carrier 600 is again detached from joining layer 601 after mounting the semiconductor components 10 and the insulation layer 30 on the carrier 600. Advantageously, a waveguide effect occurring in the carrier 600 is thus eliminated. As a result, the visual crosstalk of adjacent arrangements 1 can be reduced. The remaining joining layer 601 can subsequently be patterned to further improve coupling out of electromagnetic radiation. The joining layer 601 is used as output element 20.

Figure 12:
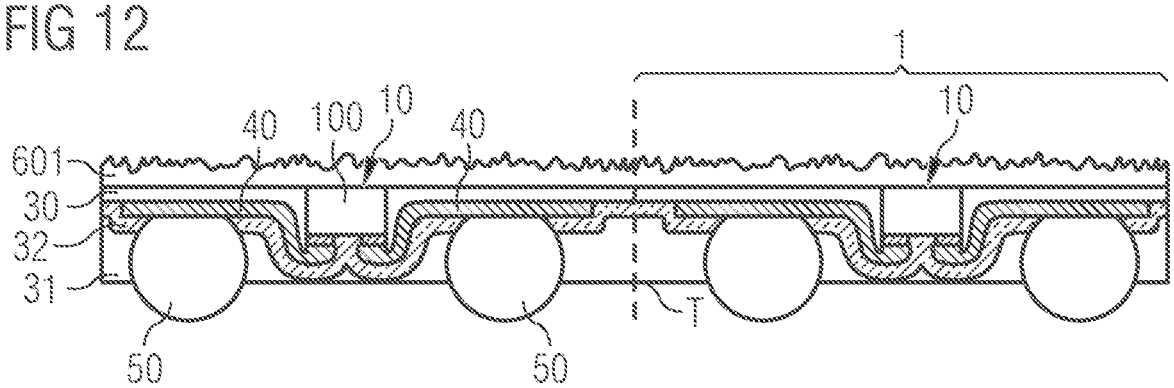
FIG. 12 shows a schematic sectional view of a plurality of arrangements described herein according to a twelfth exemplary embodiment.

FIG. 12 shows a schematic sectional view of a plurality of arrangements 1 described herein according to a twelfth exemplary embodiment. The twelfth exemplary embodiment is substantially the same as the eleventh exemplary embodiment. In the twelfth exemplary embodiment of an arrangement 1 shown herein, a second insulation layer 31 is applied to the side of the insulation layer 30 opposite to the output coupling layer 602. The second insulation layer is introduced in the region between the connection bodies 50 and the protective layer 32. The second insulation layer may be formed with an epoxy or an acrylate, for example. The second insulation layer 31 further contributes to the mechanical stabilization of the arrangement 1.

Figure 13:
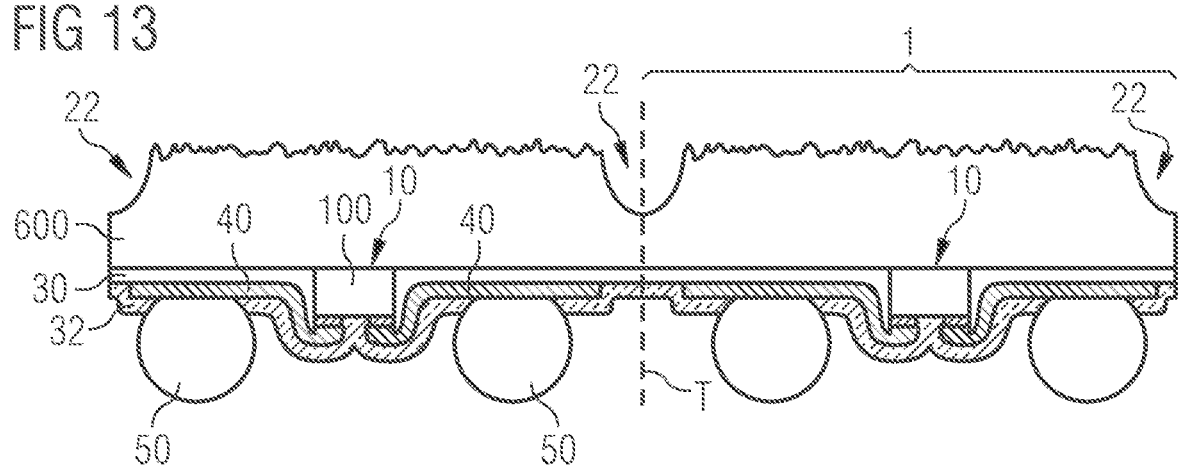
FIG. 13 shows a schematic sectional view of a plurality of arrangements described herein according to a thirteenth exemplary embodiment.

FIG. 13 shows a schematic sectional view of a plurality of arrangements 1 described herein according to a 13th exemplary embodiment. The 13th exemplary embodiment corresponds substantially to the second exemplary embodiment. The embodiment of arrangements 1 shown herein comprises a structured carrier 600, with a structure for coupling out electromagnetic radiation emitted in the optoelectronic semiconductor components 10. Furthermore, a trench 22 is introduced into the carrier 600 peripherally extending at the edge. The trench 22 may be introduced into the carrier 600, for example, by means of sawing, scribing, or glass molding. The trench 22 reduces a waveguide effect in the carrier 600 and thus contributes to a reduction of the visual crosstalk of adjacent arrangements 1.

Figure 14:
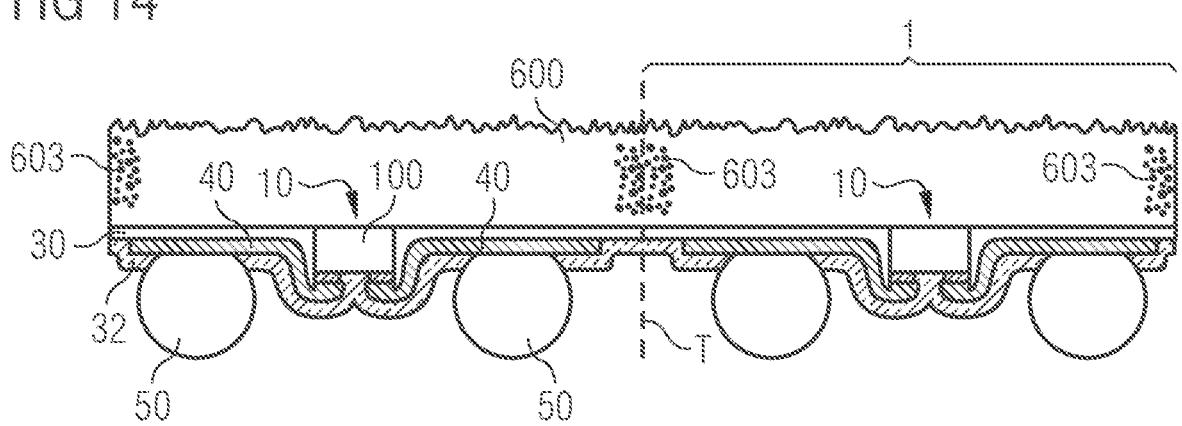
FIG. 14 shows a schematic sectional view of a plurality of arrangements described herein according to a fourteenth exemplary embodiment.

FIG. 14 shows a schematic sectional view of a plurality of arrangements 1 described herein according to a 14th exemplary embodiment. The 14th exemplary embodiment corresponds substantially to the second exemplary embodiment. The 14th exemplary embodiment shown herein includes a carrier 600 into which a plurality of scattering centers 603 are introduced. The scattering centers 603 may vary in location and size and may be arranged, for example, at the edge sides of the arrangements 1. For example, a desired radiation pattern can be achieved or the visual crosstalk of adjacent arrangements 1 can be reduced in this way. Alternatively, scattering centers 603 could also be arranged directly above the region of the optoelectronic semiconductor components 10, for example to ensure better color mixing and more homogeneous radiation of the various semiconductor components 10. For example, scattering centers 603 can be generated by means of an internal laser engraving.

Figure 15:
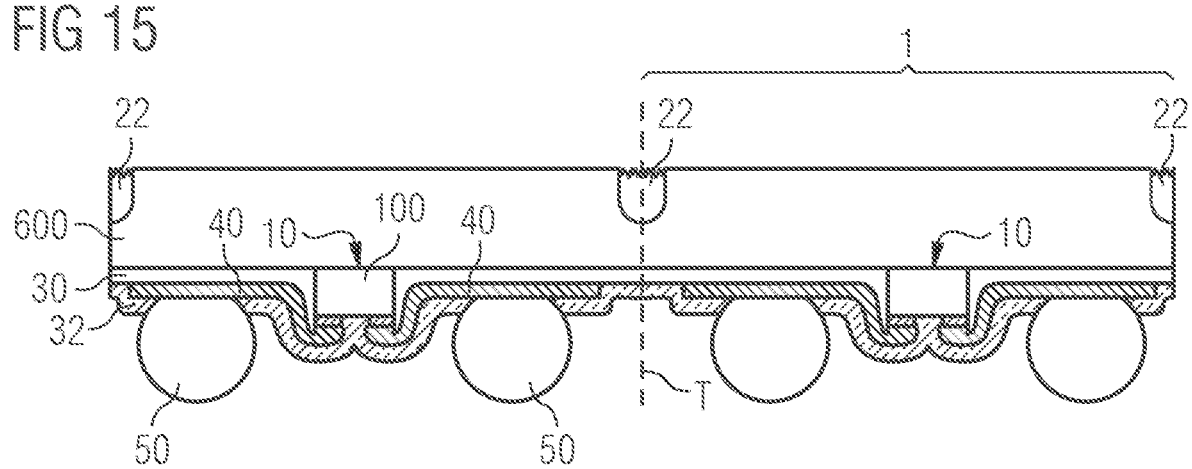
FIG. 15 shows a schematic sectional view of a plurality of arrangements described herein according to a fifteenth exemplary embodiment.

FIG. 15 shows a schematic sectional view of a plurality of arrangements 1 described herein according to a 15th exemplary embodiment. The 15th exemplary embodiment is substantially the same as the second exemplary embodiment. The 15th exemplary embodiment illustrated herein includes trenches 22 formed in the carrier 600 peripherally extending around the edges of each arrangement 1. The trenches 22 are filled with an optically absorbing material to further reduce crosstalk between adjacent arrangements 1. The absorbing material may comprise, for example, a silicone or epoxy filled with absorbing particles.

Figure 16:
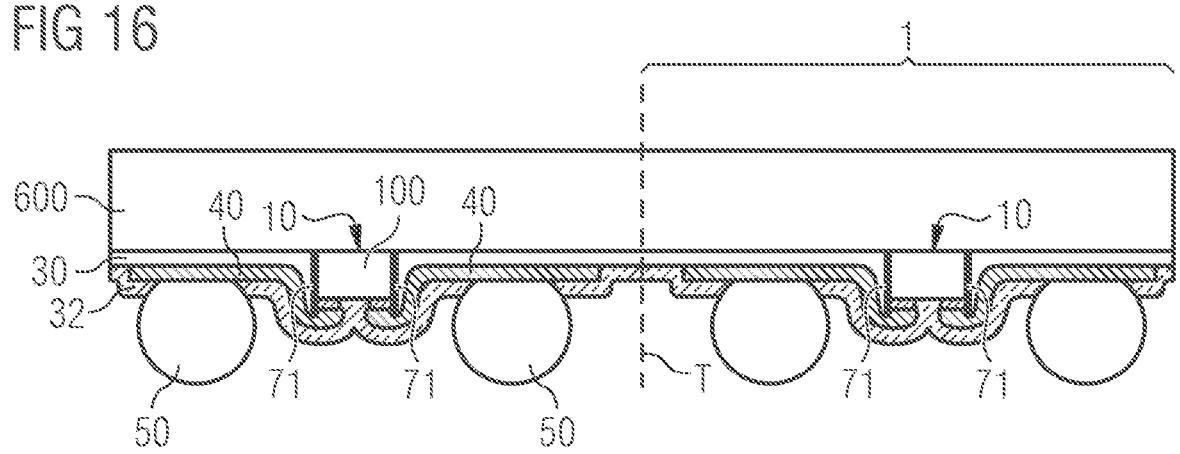
FIG. 16 shows a schematic sectional view of a plurality of arrangements described herein according to a sixteenth exemplary embodiment.

FIG. 16 shows a schematic sectional view of a plurality of arrangements 1 described herein according to a 16th exemplary embodiment. The 16th exemplary embodiment is substantially the same as the second exemplary embodiment. The shown 16th embodiment example comprises cavities 71 on the side faces 10A of the semiconductor components 10. The cavities 71 are formed, for example, by introducing a thermally unstable material and a subsequent temperature cycle. The cavities 71 are voids filled with air, for example, and comprise a lower refractive index than the material surrounding them. The cavities 71 can thus reduce or prevent, by means of total internal reflection, a coupling out of electromagnetic radiation from the side faces 10A of the optoelectronic semiconductor components 10. Radiation that is coupled out of the side faces 10A is at least partially reflected back into the semiconductor components 10. This can advantageously increase the efficiency of the semiconductor components 10.

Figure 17:
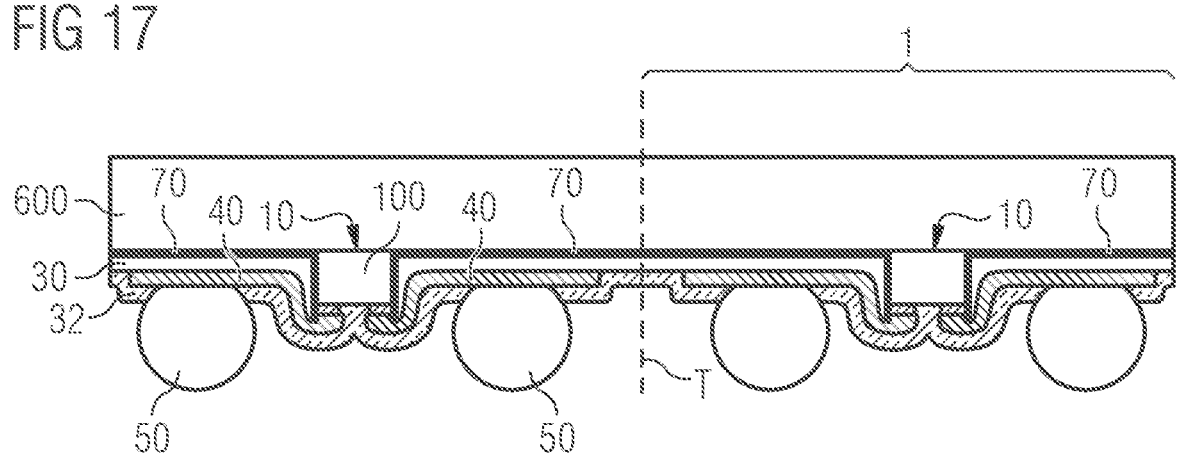
FIG. 17 shows a schematic sectional view of a plurality of arrangements described herein according to a seventeenth exemplary embodiment.

FIG. 17 shows a schematic sectional view of a plurality of arrangements 1 described herein according to a 17th exemplary embodiment. The 17th exemplary embodiment corresponds substantially to the second exemplary embodiment. In the 17th embodiment shown herein, the side faces 10A of the semiconductor components 10 and the interface between the carrier 600 and the insulation layer 30 are covered by a reflective coating 70. For example, the reflective coating 70 may be a thin metal layer or a layer formed with an electrically insulating material. For example, the reflective coating comprises a silicone layer filled with titanium dioxide. The reflective coating 70 serves to reflect light laterally exiting the optoelectronic semiconductor components 10 back into the optoelectronic semiconductor component 10. Further, the coating of the insulation layer 30 with the reflective coating 70 may create a bright or specular impression for an arrangement 1 to an observer.

FIG. 18 shows a schematic sectional view of a plurality of arrangements 1 described herein according to an 18th exemplary embodiment. The 18th exemplary embodiment corresponds substantially to the second exemplary embodiment. In the exemplary embodiment shown herein, a reflective coating 70 in the form of a silicone filled with a titanium dioxide is provided on the side faces 10A of the optoelectronic semiconductor components 10. The reflective coating 70 completely covers the side faces 10A of the optoelectronic semiconductor components 10 and extends to the carrier 600 and the insulation layer 30.

FIG. 19 shows a schematic sectional view of a plurality of arrangements 1 described herein according to a 19th exemplary embodiment. The 19th exemplary embodiment is substantially the same as the second exemplary embodiment. The 19th exemplary embodiment shown in FIG. 19 illustrates a simple way of separating different arrangements 1 from a continuous carrier 600. The arrangements 1 are each separated from each other at the separation point marked with a T by a separation trench. A joining layer 601, which can be thermally or visually dissolved, is provided between the arrangements 1 and the carrier 600. When the arrangements 1 are detached from the carrier 600 by dissolving the joining layer 601, the arrangements 1 are automatically separated.

Figure 20:
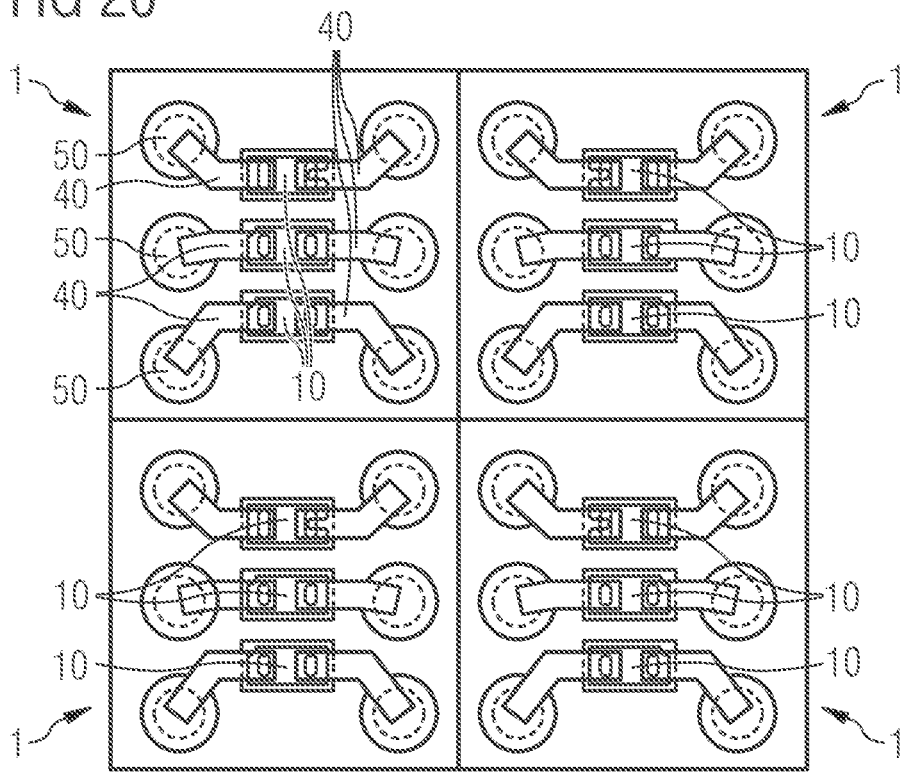
FIG. 20 shows a schematic top view of a plurality of arrangements described herein according to a twentieth exemplary embodiment.

FIG. 20 shows a schematic top view of a plurality of arrangements 1 described herein according to an exemplary embodiment 20. The 20th exemplary embodiment is substantially the same as the first exemplary embodiment. In the top view of the 20th exemplary embodiment shown in FIG. 20, the wiring of the arrangements 1 can be seen. Each arrangement 1 comprises a plurality of optoelectronic semiconductor components 10 and a plurality of connection structures 40. The connection structures 40 each provide an electrical connection of the optoelectronic semiconductor components 10 to the connection bodies 50. A cathode and an anode of each semiconductor component 10 are connected with one of the connection bodies 50. Four arrangements 1 form a module which can be mounted together, for example, on a printed circuit board. The edge length of an arrangement 1 is preferably 0.9375 mm. This wiring allows easy interchanging of anodes and cathodes by a lateral rotation of the arrangement 1 by 180°.

Figure 21:
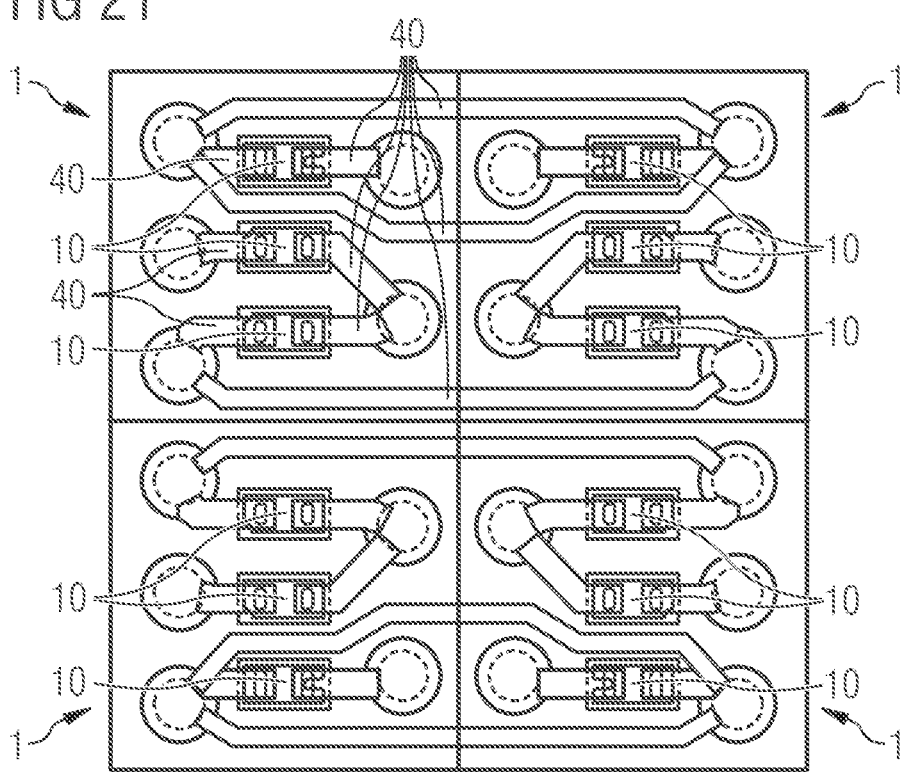
FIG. 21 shows a schematic plan view of a plurality of arrangements described herein according to a twenty first exemplary embodiment.

FIG. 21 shows a schematic top view of a plurality of arrangements 1 described herein according to a 21st exemplary embodiment. The 21st exemplary embodiment is substantially the same as the 20th exemplary embodiment. According to the 21st embodiment, the wiring of the optoelectronic semiconductor components 10 is such that the cathodes of all the optoelectronic semiconductor components 10 are looped through. A plurality of semiconductor components 10 share a connection body 50 for connecting their cathodes. The number of connection bodies 50 is thus advantageously reduced. This can result in a larger spacing of the optoelectronic semiconductor components 10 on the carrier 600. Furthermore, one level of wiring can be omitted during subsequent assembly.

Figure 22:
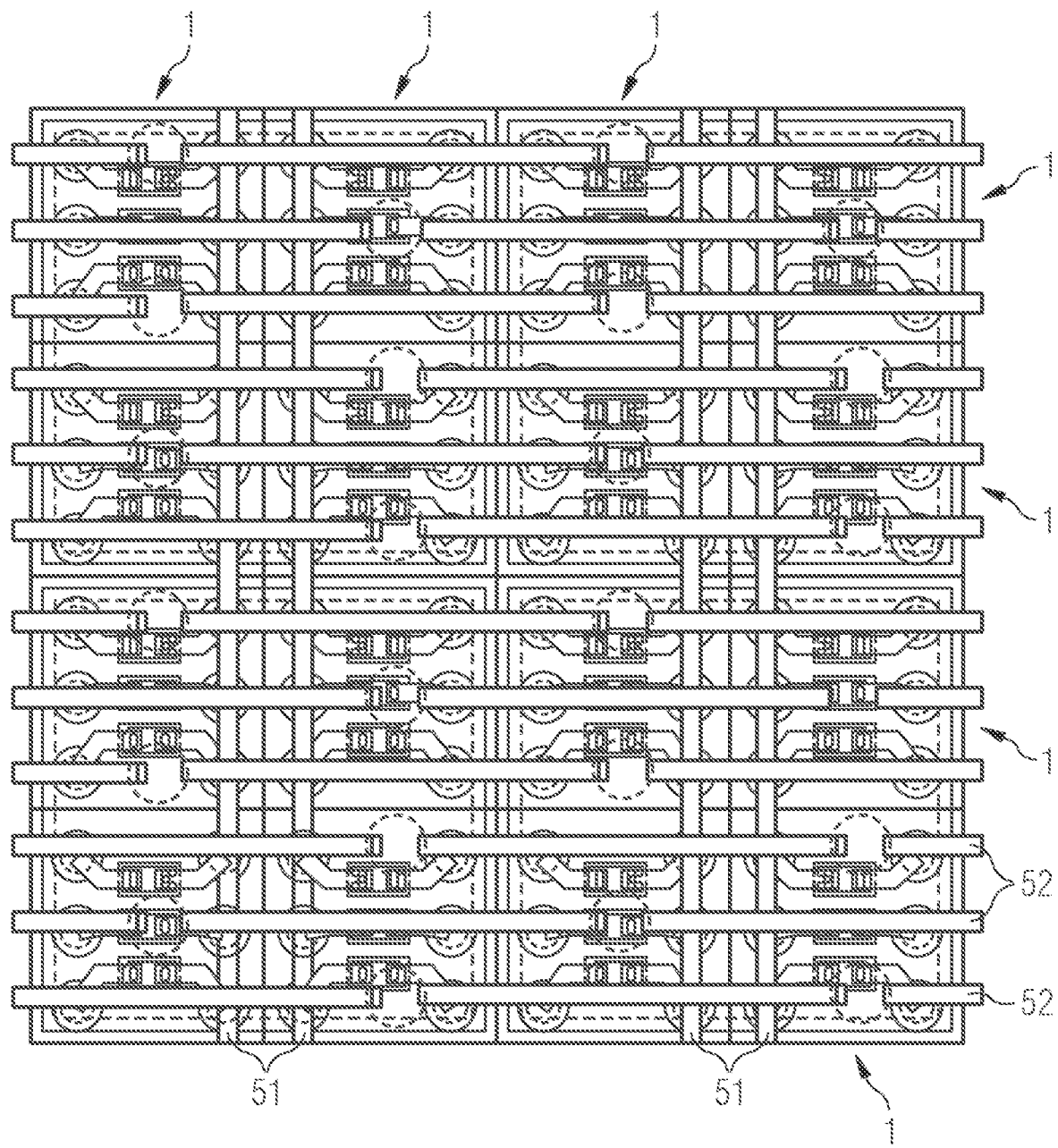
FIG. 22 shows a schematic plan view of a plurality of arrangements described herein according to a twenty second exemplary embodiment.

FIG. 22 shows a schematic top view of a plurality of arrangements 1 described herein according to a 22nd exemplary embodiment. The arrangements 1 are arranged laterally next to one another in one plane and are electrically contacted by means of first and second connection leads 51, 52. First connection leads 51 extend in the vertical direction while second connection leads 52 extend in the horizontal direction. The connection leads grant an electrical connection of all optoelectronic semiconductor components 10 of all arrangements 1. Each semiconductor component 10 can be controlled individually. For example, pixel-precise control of arrangements 1 in a visual display unit can thus be achieved.

Figure 23:
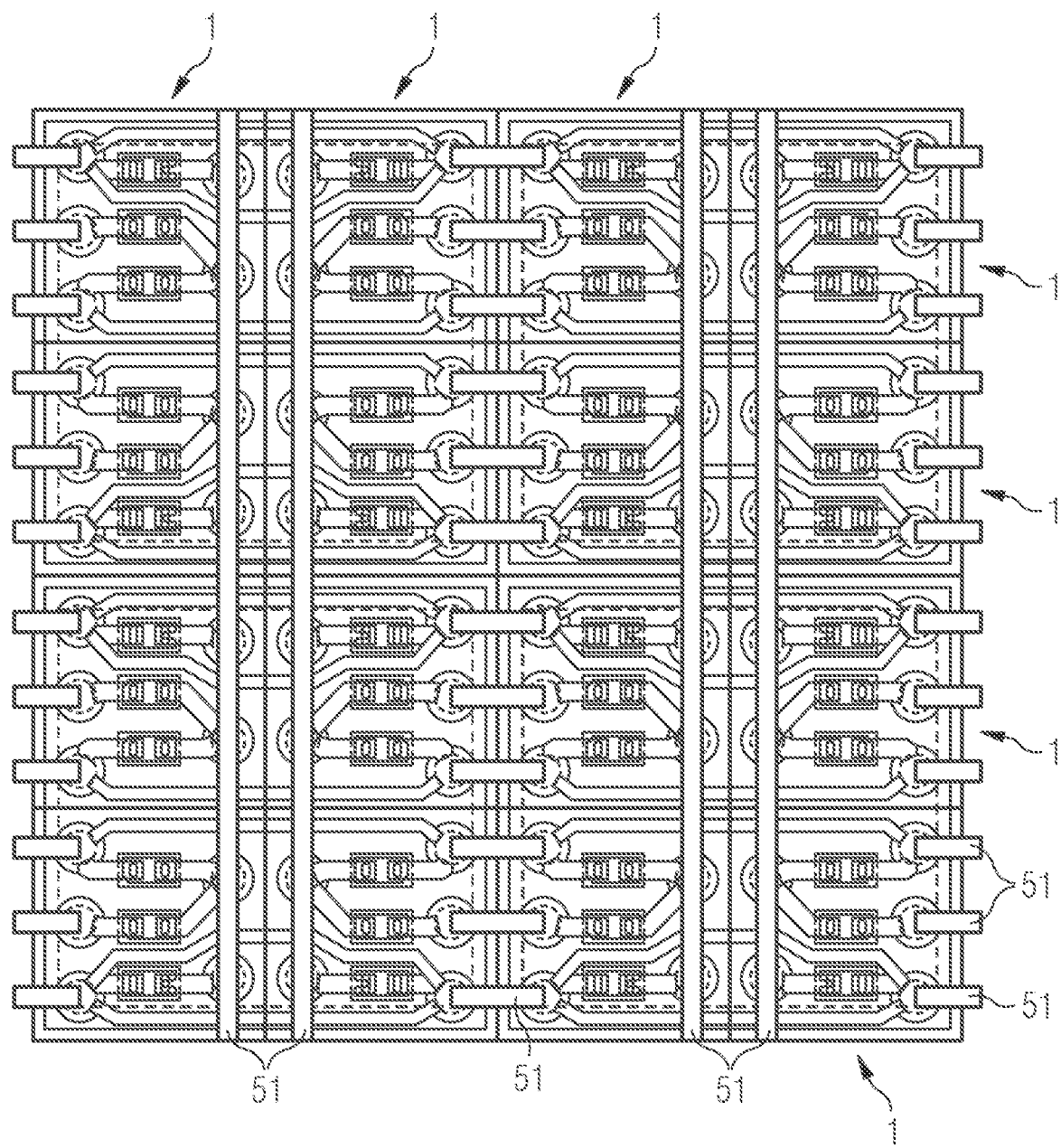
FIG. 23 shows a schematic plan view of a plurality of arrangements described herein according to a twenty third exemplary embodiment.

FIG. 23 shows a schematic top view of a plurality of arrangements 1 described herein according to a 23rd exemplary embodiment. The 23rd exemplary embodiment is substantially the same as the 22nd exemplary embodiment. The 23rd exemplary embodiment shown herein shows a plurality of arrangements 1 comprising wiring according to the 21st exemplary embodiment. By looping through the cathodes, a second connection lead 52 is advantageously omitted and a complete contacting of all optoelectronic semiconductor components 10 can be performed by means of a single layer of connection leads 51. Each semiconductor component 10 can be controlled individually. For example, pixel-precise control of arrangements 1 in a visual display unit can thus be achieved.

Figure 24:
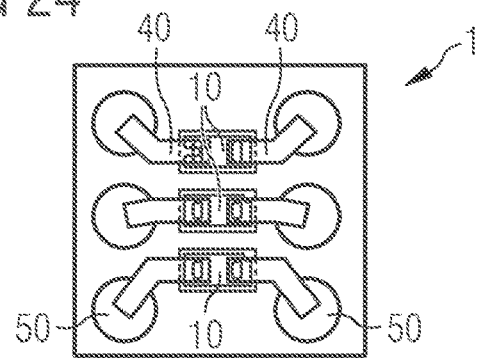
FIG. 24 shows a schematic plan view of an arrangement described herein according to a twenty fourth exemplary embodiment.

FIG. 24 shows a schematic top view of an arrangement 1 described herein according to an exemplary embodiment 24. The 24th exemplary embodiment corresponds substantially to the 20th exemplary embodiment. The arrangement 1 comprises three semiconductor components 10, each of which is electrically conductively connected by means of contact structures 40 and connection structures 50. The arrangement can be applied to a mounting carrier and used, for example, as a pixel of a video wall.

Figure 25:
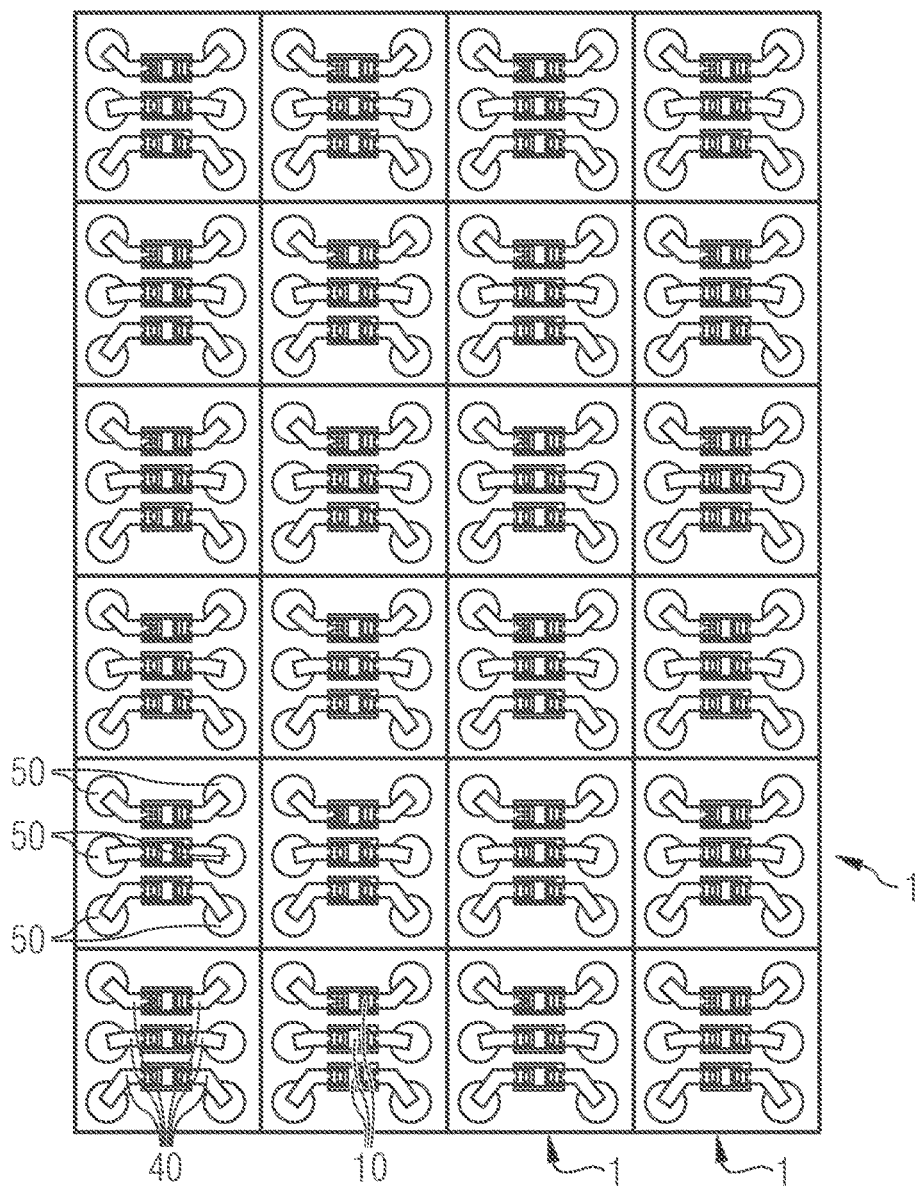
FIG. 25 shows a schematic plan view of a plurality of arrangements described herein according to a twenty fifth exemplary embodiment.

FIG. 25 shows a schematic top view of a plurality of arrangements 1 described herein according to a 25th exemplary embodiment. The 25th exemplary embodiment is substantially the same as the 24th exemplary embodiment. The 25th exemplary embodiment shows a module formed by a total of 24 arrangements 1. Advantageously, such a module can facilitate the assembly of a visual display unit.

Figure 26:
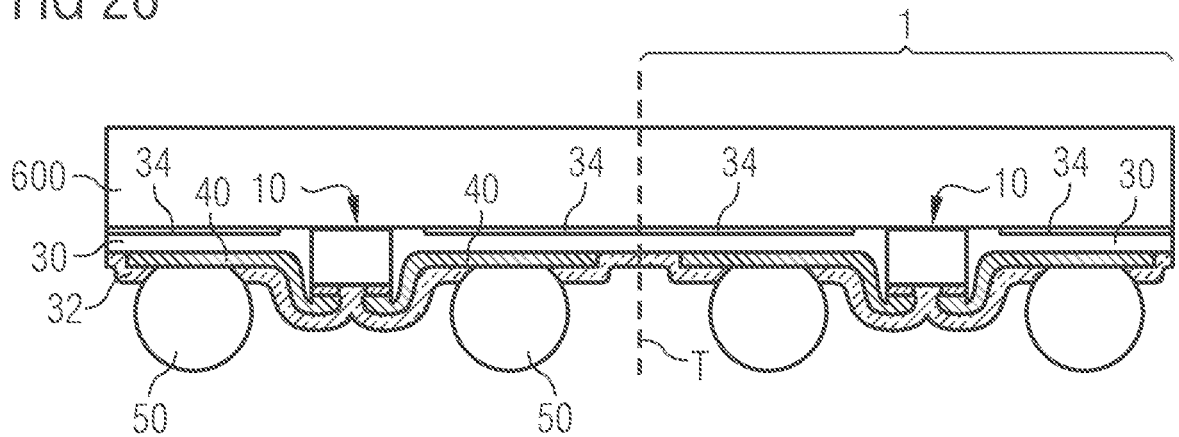
FIG. 26 shows a schematic sectional view of a plurality of arrangements described herein according to a twenty sixth exemplary embodiment.

FIG. 26 shows a schematic sectional view of a plurality of arrangements 1 described herein according to a 26th exemplary embodiment. The 26th exemplary embodiment corresponds substantially to the second exemplary embodiment. A visual reflection layer 34 is arranged between the carrier 600 and the insulation layer 30. The optical reflection layer 34 completely covers the interface between the carrier 600 and the insulation layer 30, with the exception of a region around the optoelectronic semiconductor components 10. For example, the reflection layer 34 is formed with a metal or a titanium dioxide. Thus, a specular or bright impression may be created for an observer of the arrangement 1.

Figure 27:
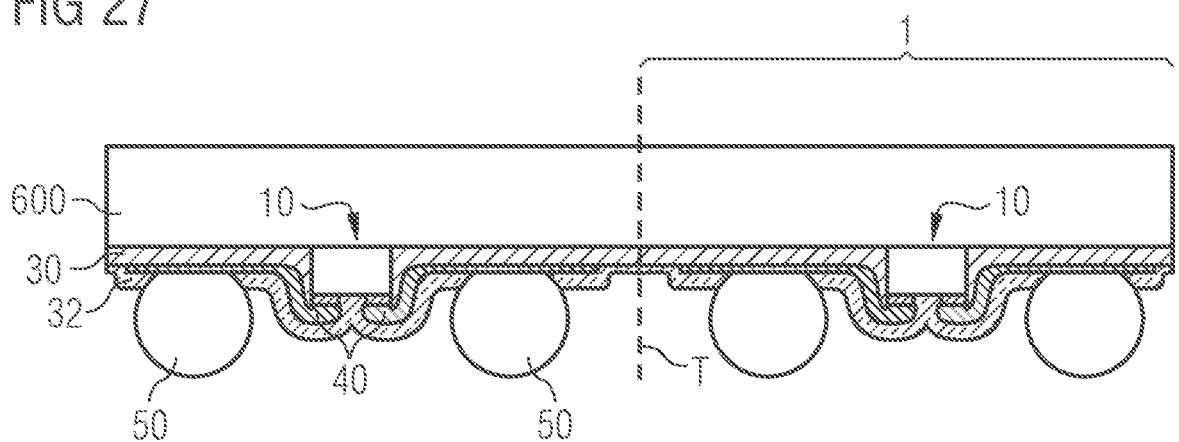
FIG. 27 shows a schematic sectional view of a plurality of arrangements described herein according to a twenty seventh exemplary embodiment.

FIG. 27 shows a schematic sectional view of a plurality of arrangements 1 described herein according to a 27th exemplary embodiment. The 27th exemplary embodiment corresponds substantially to the second exemplary embodiment. Here, the insulation layer 30 is adapted with a colored reflective material. For example, a red appearance of the arrangement 1 in its off-state can thus be achieved. Such an arrangement 1 can be used particularly advantageously, for example, in a rear light of a motor vehicle.

Figure 28:
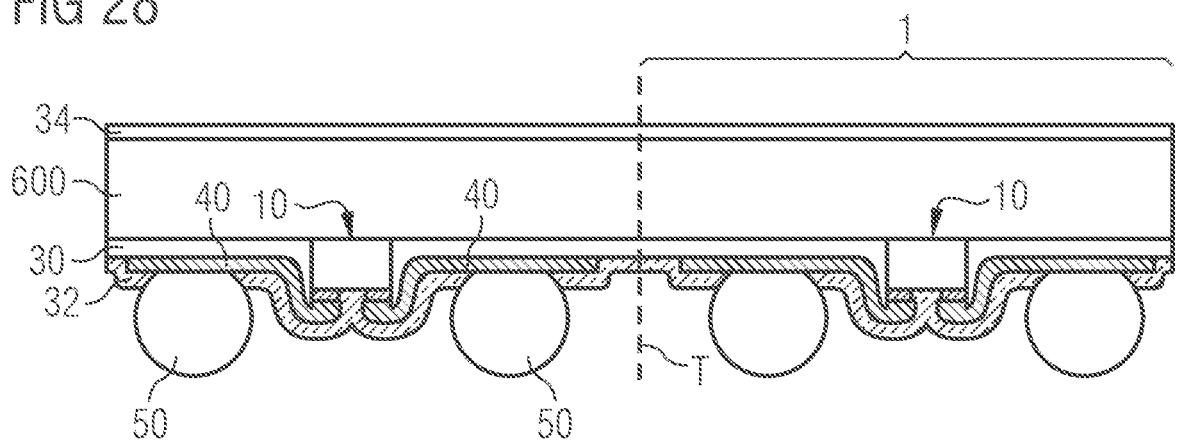
FIG. 28 shows a schematic sectional view of a plurality of arrangements described herein according to a twenty eighth exemplary embodiment.

FIG. 28 shows a schematic sectional view of a plurality of arrangements 1 described herein according to a 28th exemplary embodiment. The 28th exemplary embodiment corresponds substantially to the second exemplary embodiment. A reflection layer 34 is applied to the carrier 600 on the side opposite to the optoelectronic semiconductor components 10. Such an applied reflective layer is comparable with a semi-transparent mirror and thus gives the viewer the impression of a specular surface in the off-state of the arrangements 1.

Figure 29A:
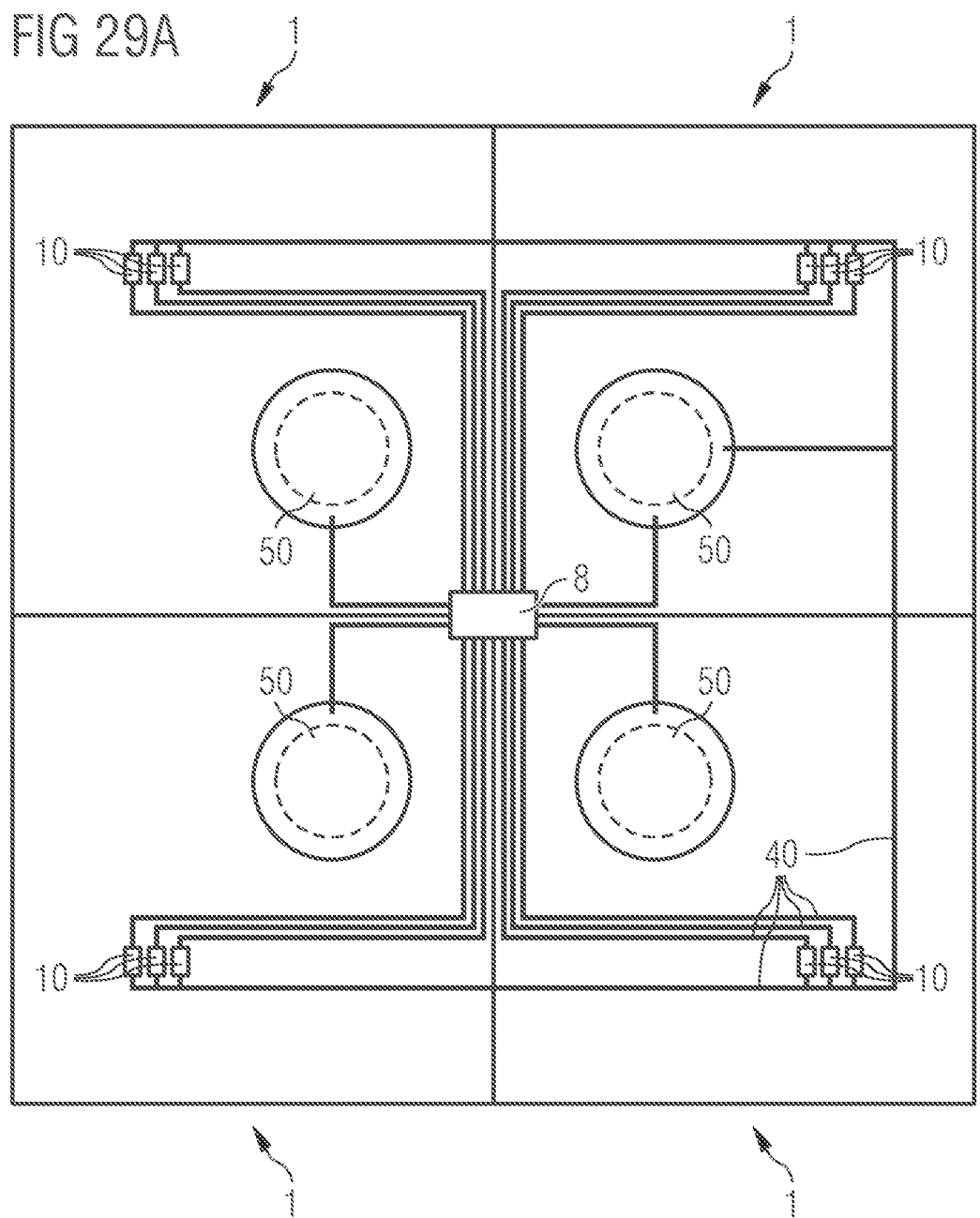
FIGS. 29A and 29B show a schematic plan view (FIG. 28A), and a sectional view (FIG. 28B) of a plurality of arrangements described herein according to a twenty ninth exemplary embodiment.

FIG. 29A shows a schematic top view of a plurality of arrangements 1 described herein according to an exemplary embodiment 29. The 29th exemplary embodiment corresponds substantially to the eighth exemplary embodiment. An integrated circuit 8 is arranged between four arrangements 1. The arrangements 1 are driven together by the integrated circuit 8. The integrated circuit 8 is electrically connected by means of connection bodies 50. The integrated circuit 8 is connected with each of the optoelectronic semiconductor components 10, and can provide a single pixel-precise driving of the optoelectronic semiconductor components 10. In particular, the integrated circuit 8 is an active matrix IC.

Figure 29B:
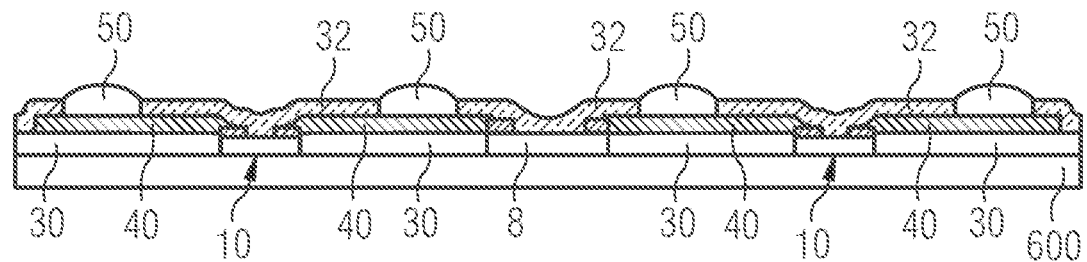

FIG. 29B shows a schematic sectional view of a plurality of arrangements 1 described herein according to the 29th exemplary embodiment. In the schematic sectional view, it can be seen that the integrated circuit 8 is arranged in the same plane as the optoelectronic semiconductor components 10. The positioning of the connection bodies 50 can, for example, be next to or even directly above the optoelectronic semiconductor components 10.

Figure 30A:
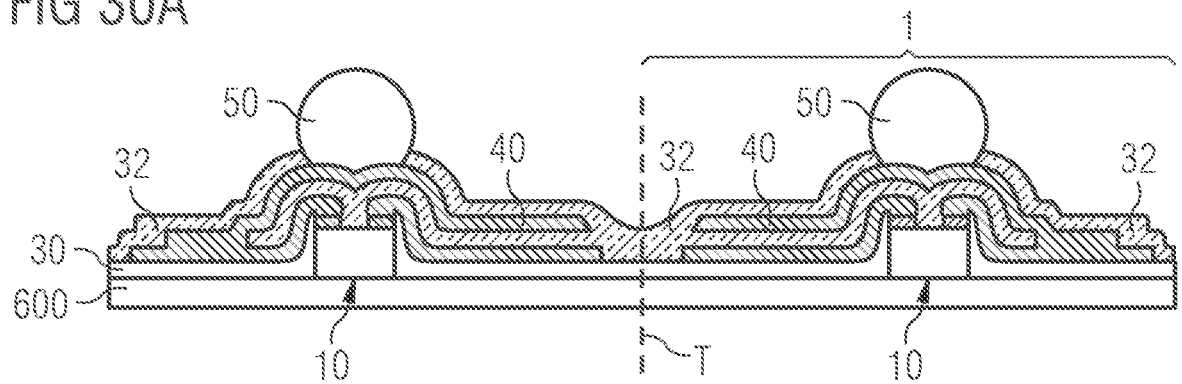
FIGS. 30A and 30B show schematic sectional views of a plurality of arrangements described herein, according to a thirtieth exemplary embodiment, at various stages of a method for producing them.

FIG. 30A shows a schematic sectional view of a plurality of arrangements 1 described herein according to a 30th exemplary embodiment in a first stage of a method for producing the same. A plurality of arrangements 1 with semiconductor components 10 are arranged on a carrier 60o and electrically contacted by means of connection structures 40. Arranged directly above the semiconductor components 10 are connection bodies 50 connected with the connection structures 40. The connection structures 40 comprise several layers, each of which is separated from the other by a layer of a protective layer 32.

Figure 30B:
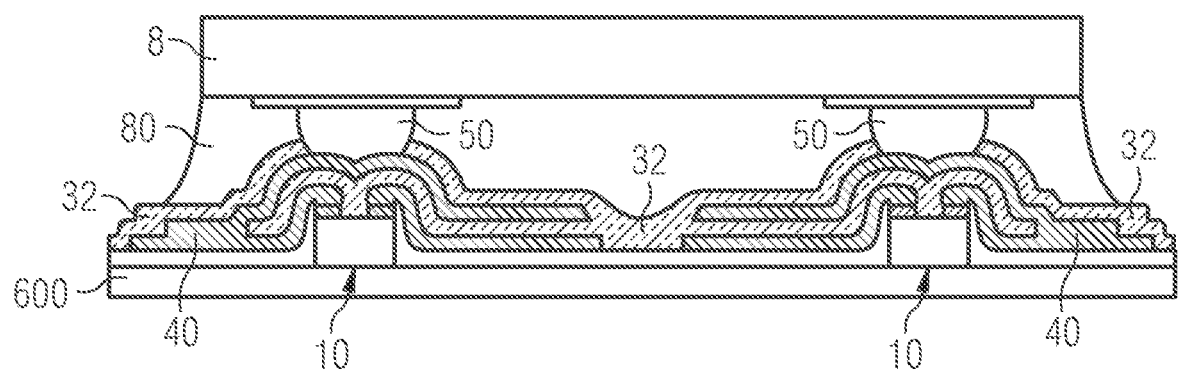

FIG. 30B shows a schematic sectional view of a plurality of arrangements 1 described herein according to the 30th exemplary embodiment in a further step of a method for producing the same. An integrated circuit 8 is applied to the connection bodies 50. The integrated circuit is used for driving all semiconductor components 10. A packing 80 spaces the integrated circuit 8 from the connection bodies 50 and the optoelectronic semiconductor components 10. The packing is formed with a silicone, an epoxy or an acrylate.

Figure 31:
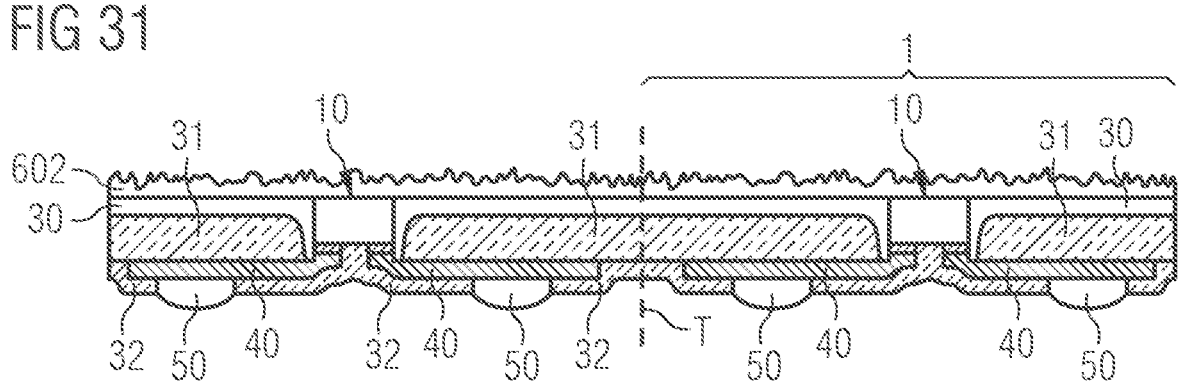
FIG. 31 shows a schematic sectional view of a plurality of arrangements described herein, according to a thirty first exemplary embodiment.

FIG. 31 shows a schematic sectional view of a plurality of arrangements 1 described herein according to an exemplary embodiment 31. The 31st exemplary embodiment corresponds substantially to the eleventh exemplary embodiment. The arrangements 1 shown herein include an insulation layer 30 and a second insulation layer 31, as well as a joining layer 601 and an output coupling layer 602. The second insulation layer is provided on the side of the insulation layer 30 opposite to the output coupling layer 602. The second insulation layer 31 is introduced between the insulation layer 30 and the connection structures 40 to provide planarization and mechanical stabilization of the arrangement 1. The second insulation layer is formed with a silicone, an epoxy or an acrylate. The connection bodies 50 are flat, cushion-shaped regions formed with a solder material.

Figure 32:
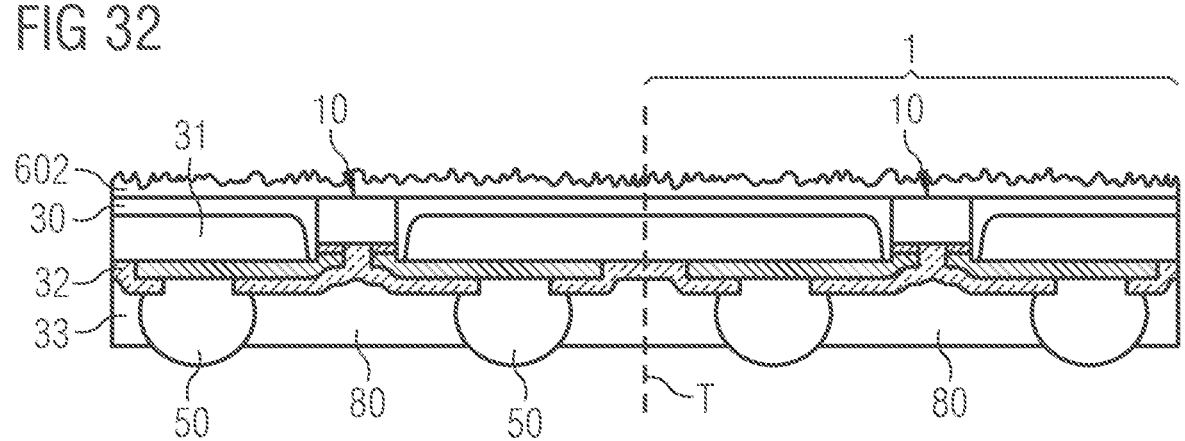
FIG. 32 shows a schematic sectional view of a plurality of arrangements described herein, according to a thirty second exemplary embodiment.

FIG. 32 shows a schematic sectional view of a plurality of arrangements 1 described herein according to a 32nd exemplary embodiment. The 32nd exemplary embodiment is substantially the same as the 31st exemplary embodiment. The 32nd exemplary embodiment comprises connection bodies 50 in the form of solder balls. A shaped body 33 is provided on the side of the protective layer 32 facing away from the optoelectronic semiconductor component 10 for planarizing the connection bodies 50. The shaped body 33 serves for further mechanical stabilization and planarization of the arrangements 1. The shaped body 33 is formed, for example, with an acrylate, an epoxy or a silicone.

Figure 33:
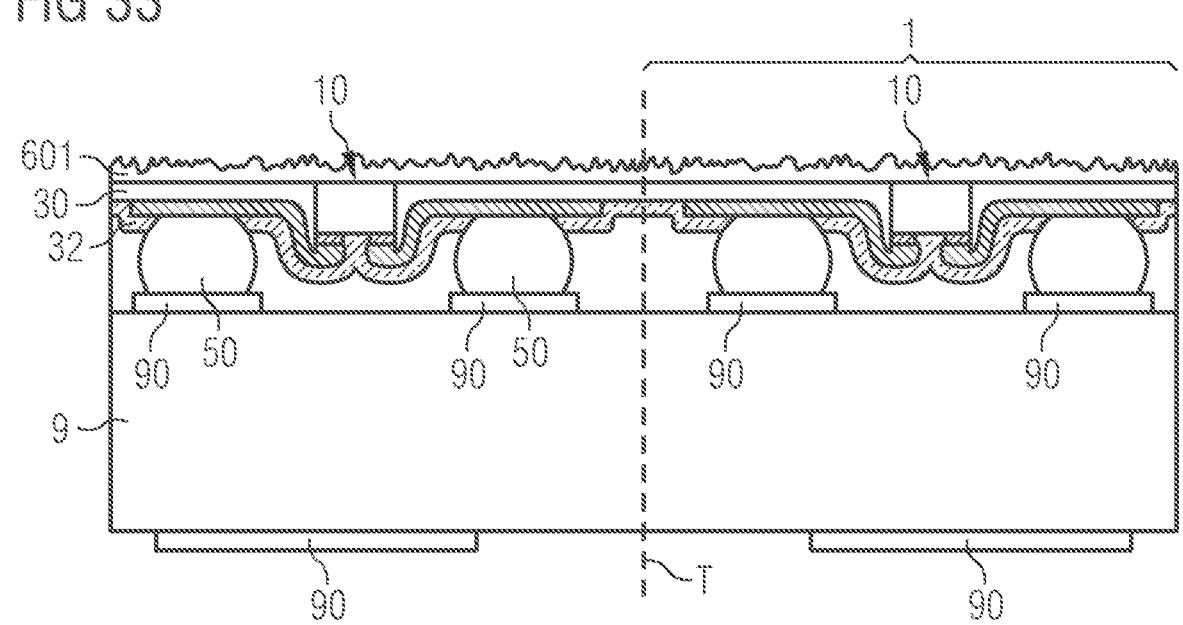
FIG. 33 shows a schematic sectional view of a plurality of arrangements described herein according to a thirty third exemplary embodiment.

FIG. 33 shows a schematic sectional view of a plurality of arrangements 1 described herein according to a 33rd exemplary embodiment. The 33rd exemplary embodiment corresponds substantially to the twelfth exemplary embodiment. The arrangements 1 shown herein are arranged on a common printed circuit board 9. The printed circuit board 9 includes a plurality of connection areas 90 and serves as an electrically conductive carrier for the arrangements 1.

Figure 34A:
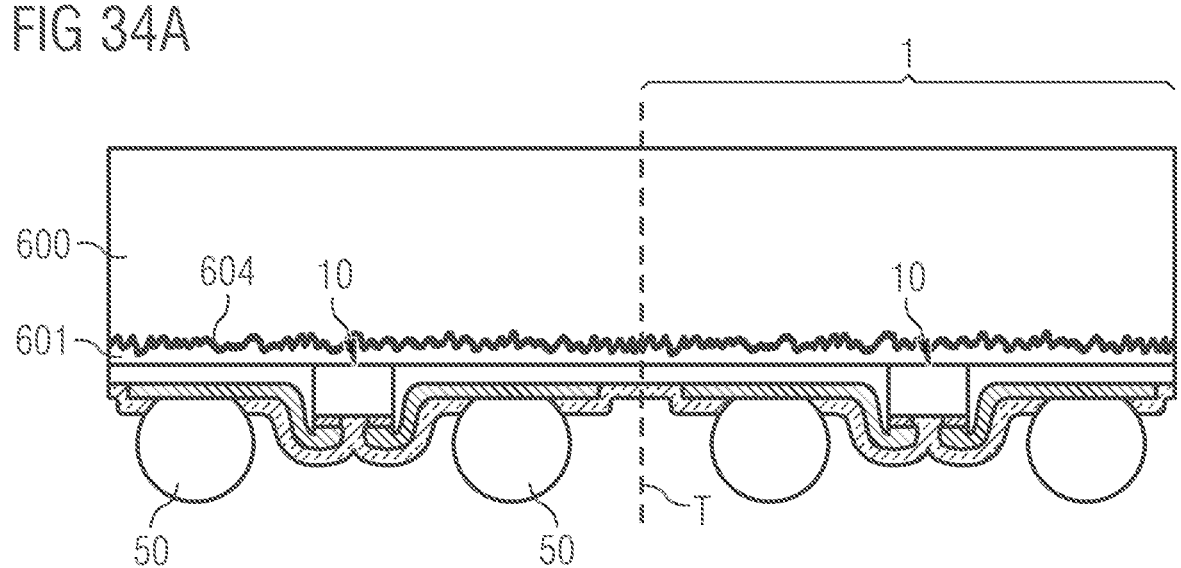
FIGS. 34A and 34B show schematic sectional views of a plurality of arrangements described herein, according to a thirty fourth exemplary embodiment, at various stages of a method for producing them.

FIG. 34A shows a schematic sectional view of a plurality of arrangements 1 described herein according to a 34th exemplary embodiment. The 34th exemplary embodiment corresponds substantially to the second exemplary embodiment. In addition to the carrier 600 and a joining layer 601, the arrangements 1 shown herein include a release layer 604. The release layer 604 is arranged between the joining layer 601 and the carrier 600. The release layer 604 is a layer that can be released or dissolved, for example, by means of thermally or visually induced radiation. For example, the carrier 600 can thus be easily detached from the arrangement 1 in a subsequent detachment step.

The carrier 600 shown here comprises a structuring on its side facing the joining layer 601. The structuring of the carrier 600 is imprinted as a negative shape in the joining layer 601. After the carrier 600 has been detached, the negative form of the structuring remains in the joining layer 601, whereby the joining layer 601 already comprises a structuring for coupling out radiation.

Figure 34B:
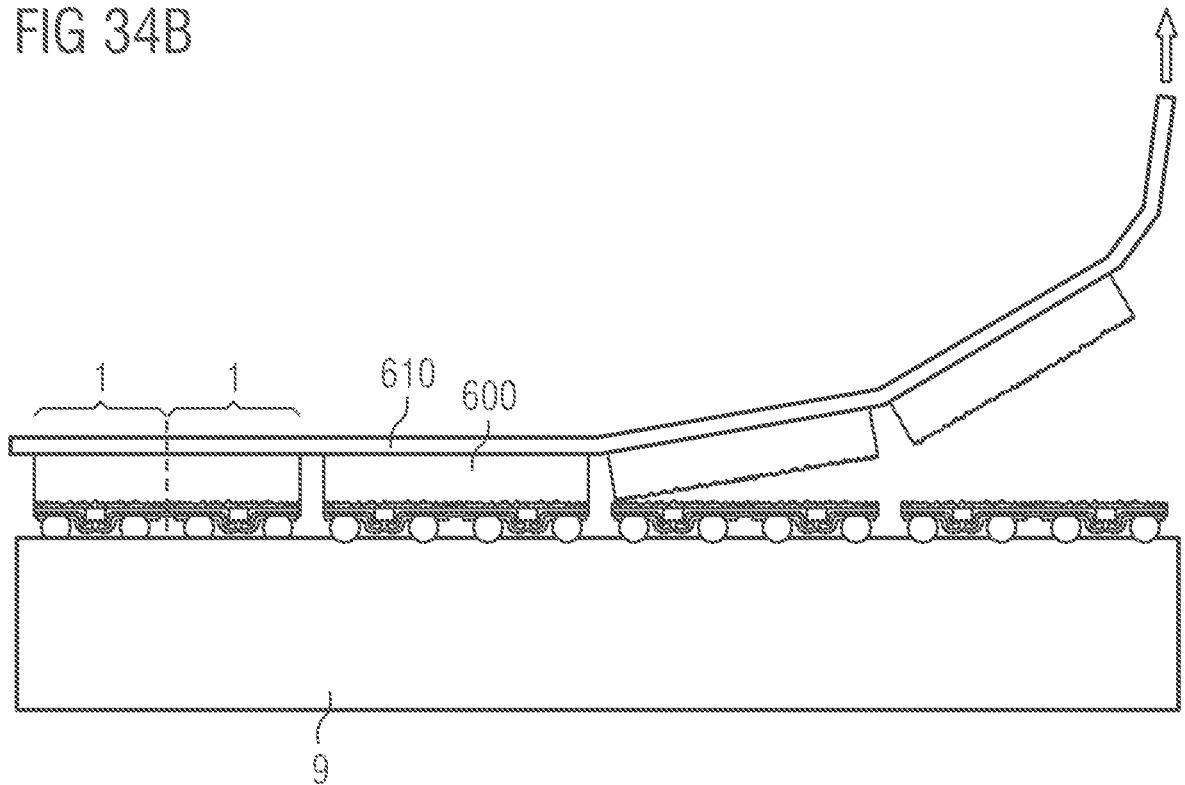

FIG. 34B shows a schematic sectional view of a plurality of arrangements 1 described herein according to the 34th exemplary embodiment. By mounting a plurality of arrangements 1 with their side of the carriers 600 facing away from the optoelectronic semiconductor components 10 on a temporary carrier 610, good handling and easy transportation of a plurality of arrangements 1 is possible. After mounting the arrangements 1 on a printed circuit board 9, the carrier 600 can be detached from each of the arrangements 1, for example, by means of mechanical traction on the temporary carrier 610. For example, the temporary carrier 610 is formed with a tear-resistant polymer film.

Figure 35:
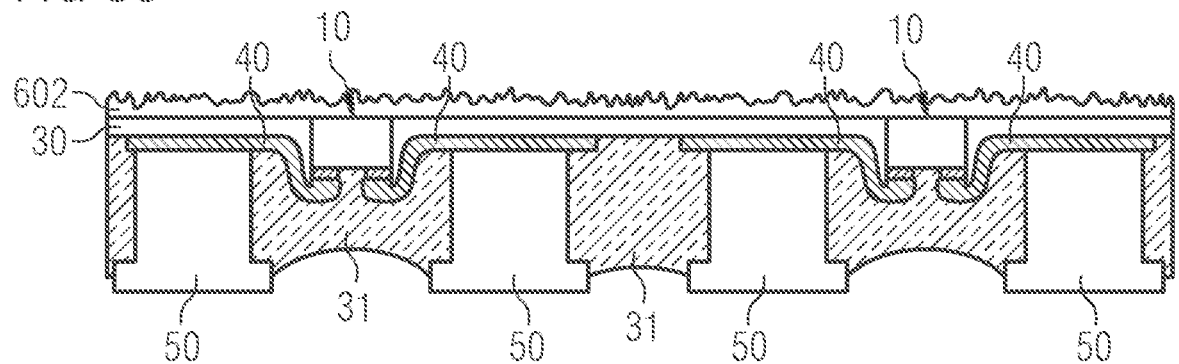
FIG. 35 shows a schematic sectional view of a plurality of arrangements described herein, according to a thirty fifth exemplary embodiment.

FIG. 35 shows a schematic sectional view of a plurality of arrangements 1 described herein according to a 35th exemplary embodiment. The 35th exemplary embodiment is substantially the same as the eleventh exemplary embodiment. In the exemplary embodiment of arrangements 1 shown herein, the connection bodies 50 are copper column structures. Advantageously, a protective layer 32 can be dispensed with. The copper column structures comprise in particular a high thermal conductivity and a high mechanical stability. Furthermore, an exact distance of the optoelectronic semiconductor components 10 from a subsequent mounting surface can be set. For further stabilization of the arrangements 1, a second insulation layer 31 is applied to the insulation layer 30, which is electrically insulating and fills the space between the connection bodies 50.

Figure 36:
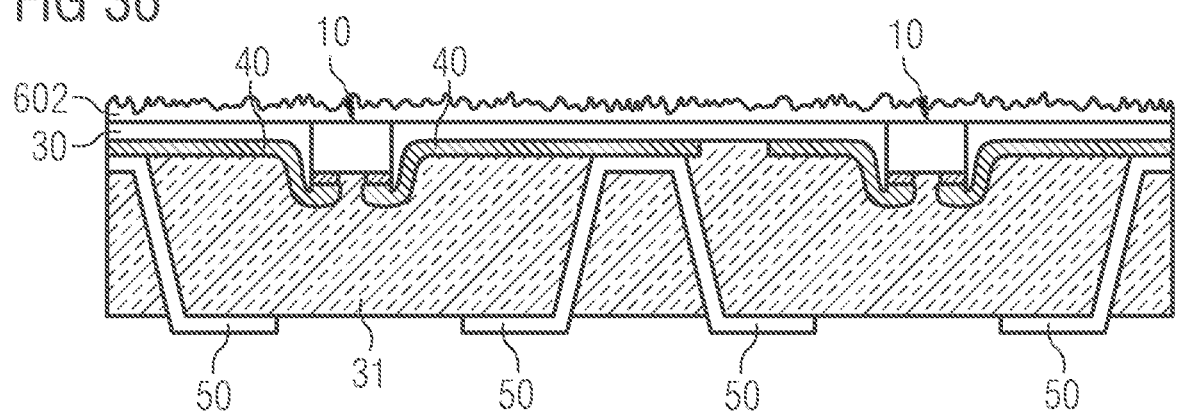
FIG. 36 shows a schematic sectional view of a plurality of arrangements described herein, according to a thirty sixth exemplary embodiment.

FIG. 36 shows a schematic sectional view of a plurality of arrangements 1 described herein according to a 36th exemplary embodiment. The 36th exemplary embodiment corresponds substantially to the eleventh exemplary embodiment. The connection bodies 50 are configured as vias through a second insulation layer 31. The vias are formed with Cu, for example. A protective layer 32 can advantageously be dispensed with. The second insulation layer can be used to planarize the arrangements 1.

Figure 37:
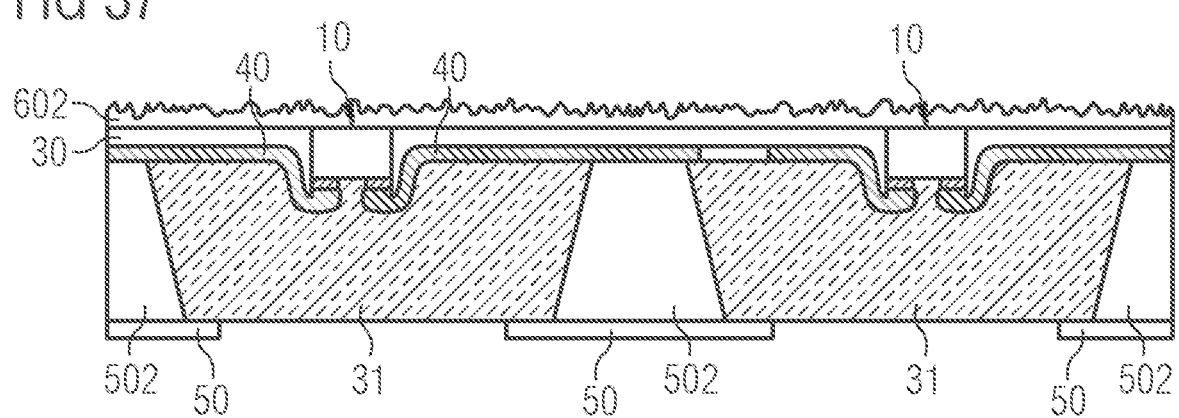
FIG. 37 shows a schematic sectional view of a plurality of arrangements described herein according to a thirty seventh exemplary embodiment.

FIG. 37 shows a schematic sectional view of a plurality of arrangements 1 described herein according to a 37th exemplary embodiment. The 37th exemplary embodiment is substantially the same as the 36th exemplary embodiment. The connection bodies 50 shown here are configured as vias by conductive filling material 502. The vias extend through the second insulation layer 31 to the connection structures 40. By way of example, the conductive filling material 502 is formed with an electrically conductive paste, in particular a paste containing silver.

Figure 38:
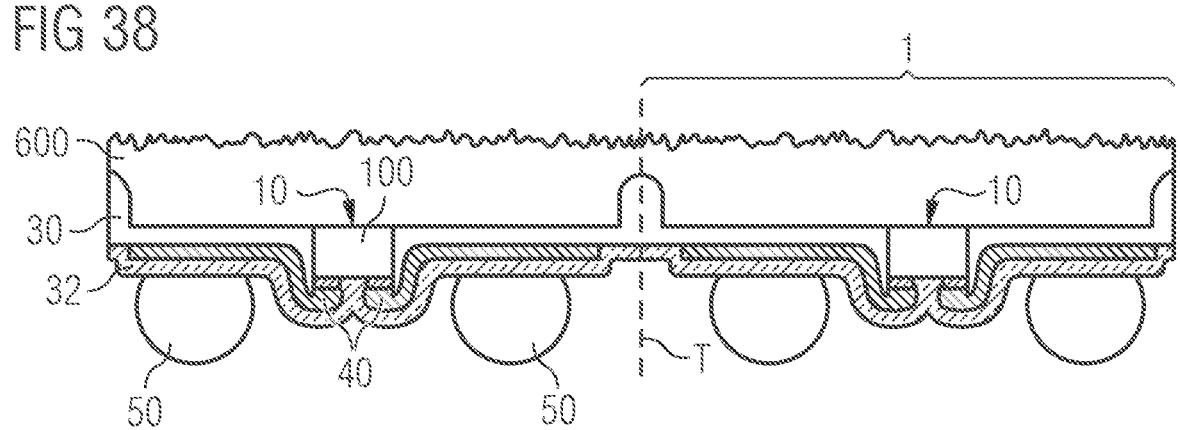
FIG. 38 shows a schematic sectional view of a plurality of arrangements described herein according to a thirty eighth exemplary embodiment.

FIG. 38 shows a schematic sectional view of a plurality of arrangements 1 described herein according to a 38th exemplary embodiment. The 38th exemplary embodiment corresponds substantially to the second exemplary embodiment. The 38th exemplary embodiment illustrated herein comprises a carrier 600 that has cutouts 22 on the side facing the insulation layer 30. The cutouts 22 are filled with the material of the insulation layer 30 and extend peripherally around each of the arrangements 1. The cutouts 22 reduce or avoid visual crosstalk from adjacent arrangements 1.

Figure 39:
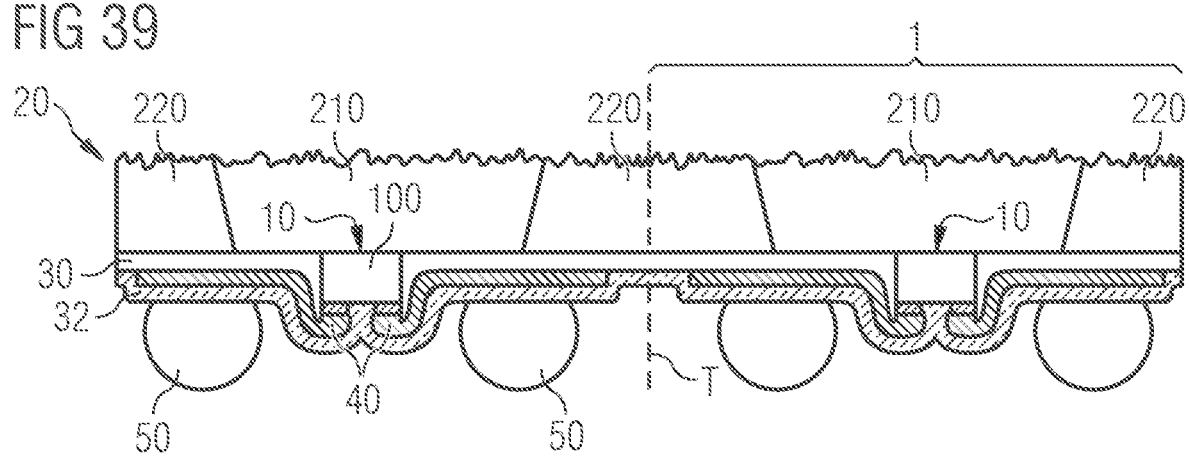
FIG. 39 shows a schematic sectional view of a plurality of arrangements described herein according to a thirty ninth exemplary embodiment.

FIG. 39 shows a schematic sectional view of a plurality of arrangements 1 described herein according to a 39th exemplary embodiment. The 39th exemplary embodiment corresponds substantially to the second exemplary embodiment. The output element 20 of the arrangements 1 includes a plurality of radiation permeable regions 210 and a plurality of absorbing regions 220. The radiation permeable regions 210 are respectively aligned with the lateral positioning of the optoelectronic semiconductor components 10. Thus, unobstructed emission of radiation emitted from the optoelectronic semiconductor components 10 is possible. At the same time, an absorbing region 220 is located between each two arrangements 1. The absorbing region 220 prevents or reduces optical crosstalk of adjacent arrangements 1 and thus advantageously increases the contrast. For example, such an output element 20 is formed with a plastic.

Figure 40:
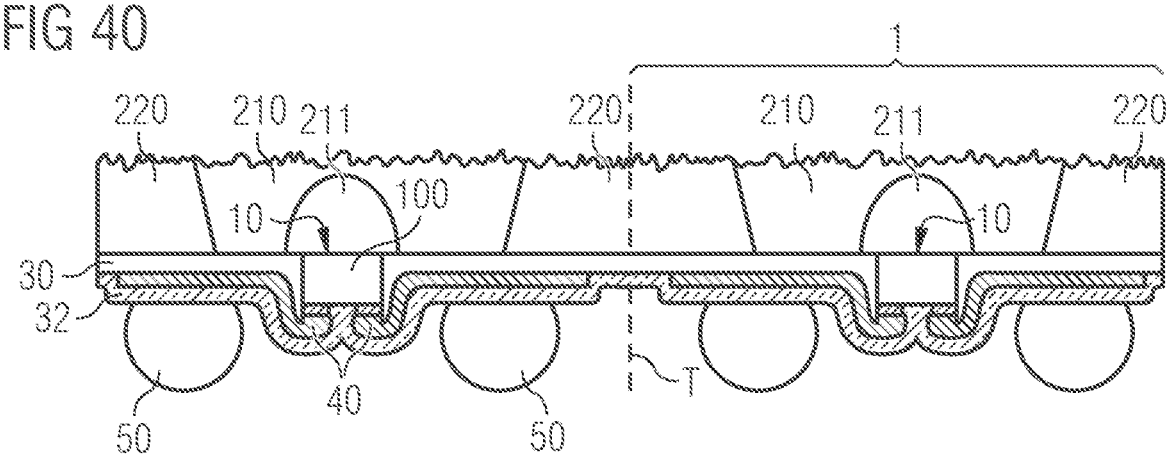
FIG. 40 shows a schematic sectional view of a plurality of arrangements described herein according to a fortieth exemplary embodiment.

FIG. 40 shows a schematic sectional view of a plurality of arrangements 1 described herein according to a 40th exemplary embodiment. The 40th exemplary embodiment corresponds substantially to 39th exemplary embodiment. Second radiation permeable regions 211 are additionally introduced in the radiation permeable regions 210 of the output element 20. The second radiation permeable regions 211 differ from the first radiation permeable regions 210 in their refractive index. For example, the shape of the second radiation permeable regions 211 is that of a convex lens. The second radiation permeable region 211 can thus contribute to a beam shaping, in particular to a reduction of the divergence, of the electromagnetic radiation emitted by the optoelectronic semiconductor components 10.

Figure 41:
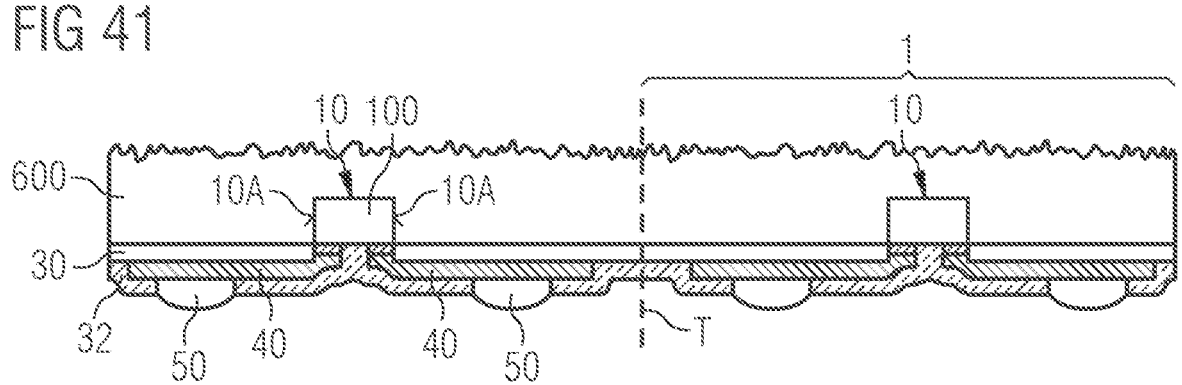
FIG. 41 shows a schematic sectional view of a plurality of arrangements described herein according to a forty first exemplary embodiment.

FIG. 41 shows a schematic sectional view of a plurality of arrangements 1 described herein according to a 41st exemplary embodiment. The 41st exemplary embodiment corresponds substantially to the fifth exemplary embodiment. The optoelectronic semiconductor components 10 are embedded in the carrier 600 and advantageously comprise a planar side on the side facing away from the carrier 600. A mounting of the arrangement 1 on a subsequent mounting carrier is thus advantageously facilitated. The insulation layer 30 extends only in the lateral direction on the carrier 600, but not on the side faces 10A of the semiconductor components 10. The insulation layer 30 is applied to the carrier 600 by means of molding.

Figure 42:
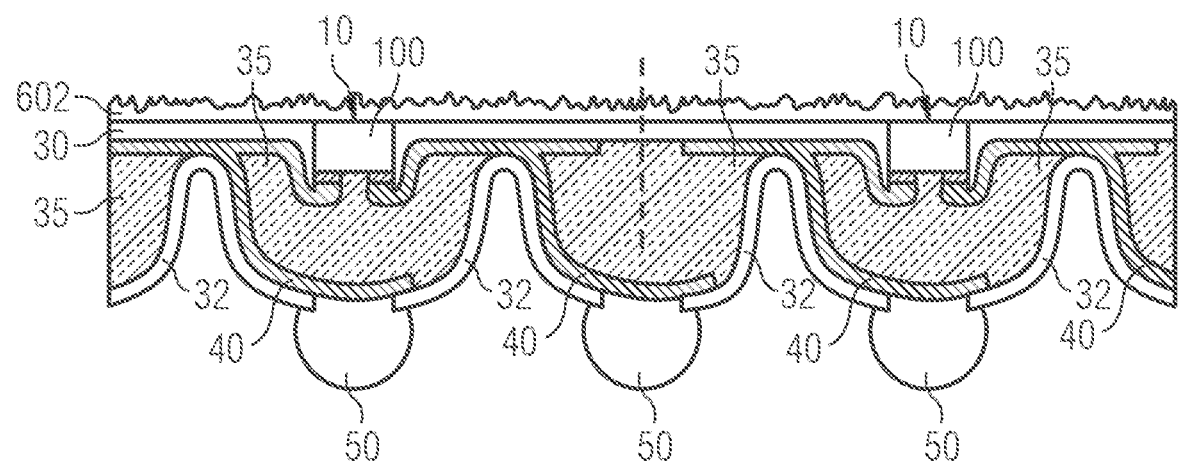
FIG. 42 shows a schematic sectional view of a plurality of arrangements described herein according to a forty second exemplary embodiment.

FIG. 42 shows a schematic sectional view of a plurality of arrangements 1 described herein according to a 42nd exemplary embodiment. The 42nd exemplary embodiment is substantially the same as the eleventh exemplary embodiment. In the arrangements 1 shown in the 42nd exemplary embodiment, a further plane of the connection structure 40 is arranged on the protective layer 32 to allow free positioning of the connection bodies 50 in the lateral direction. The second plane of the connection structure 40 is also applied by means of a planar interconnect method and is spaced from the first plane by an insulation material 35. The insulation material is electrically insulating and is formed, for example, with a polymer.

Figure 43:
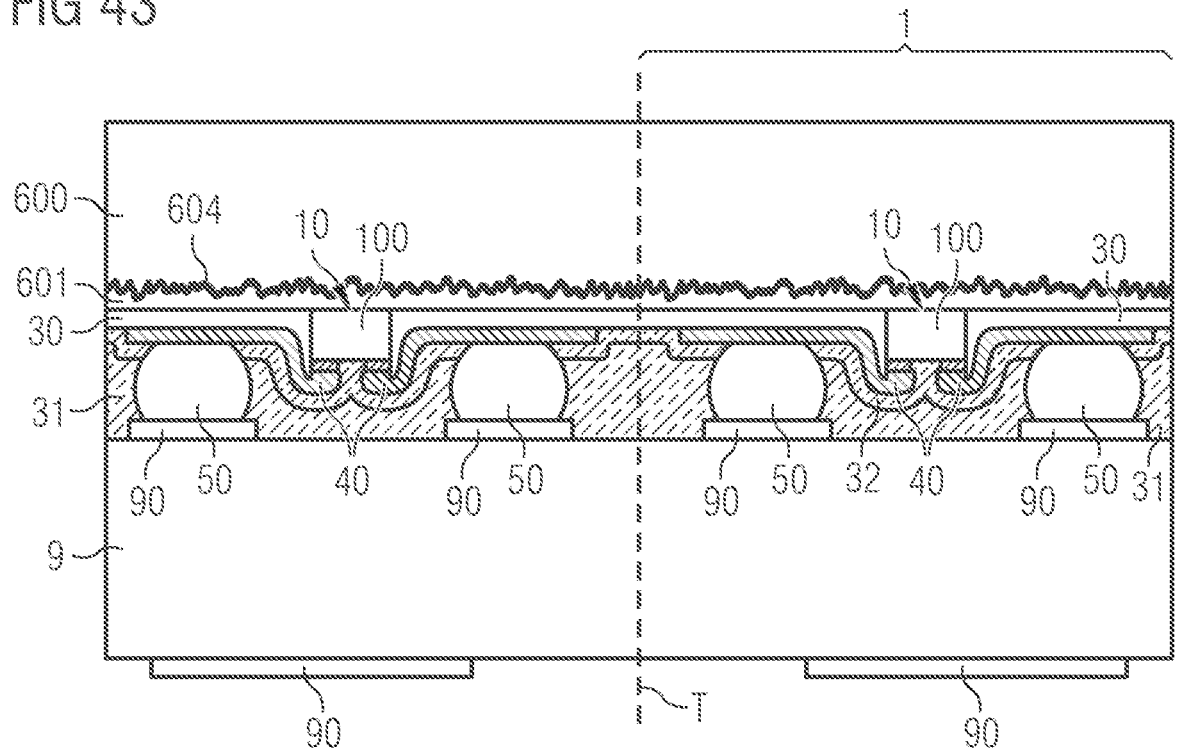
FIG. 43 is a schematic sectional view of a plurality of arrangements described herein according to a 43rd exemplary embodiment.

FIG. 43 shows a schematic sectional view of a plurality of arrangements 1 described herein according to a 43rd exemplary embodiment. The 43rd exemplary embodiment is substantially the same as the 33rd exemplary embodiment. The 43rd exemplary embodiment shows the mounting of an arrangement 1 on a printed circuit board 9 with a plurality of connection areas 90, wherein the carrier 600 is not yet detached. A joining layer 601 and a release layer 604 are arranged between the carrier 600 and the insulation layer, allowing the carrier 600 to be easily detached. The carrier 600 comprises a patterning that is imprinted in the joining layer 601.

Figure 44:
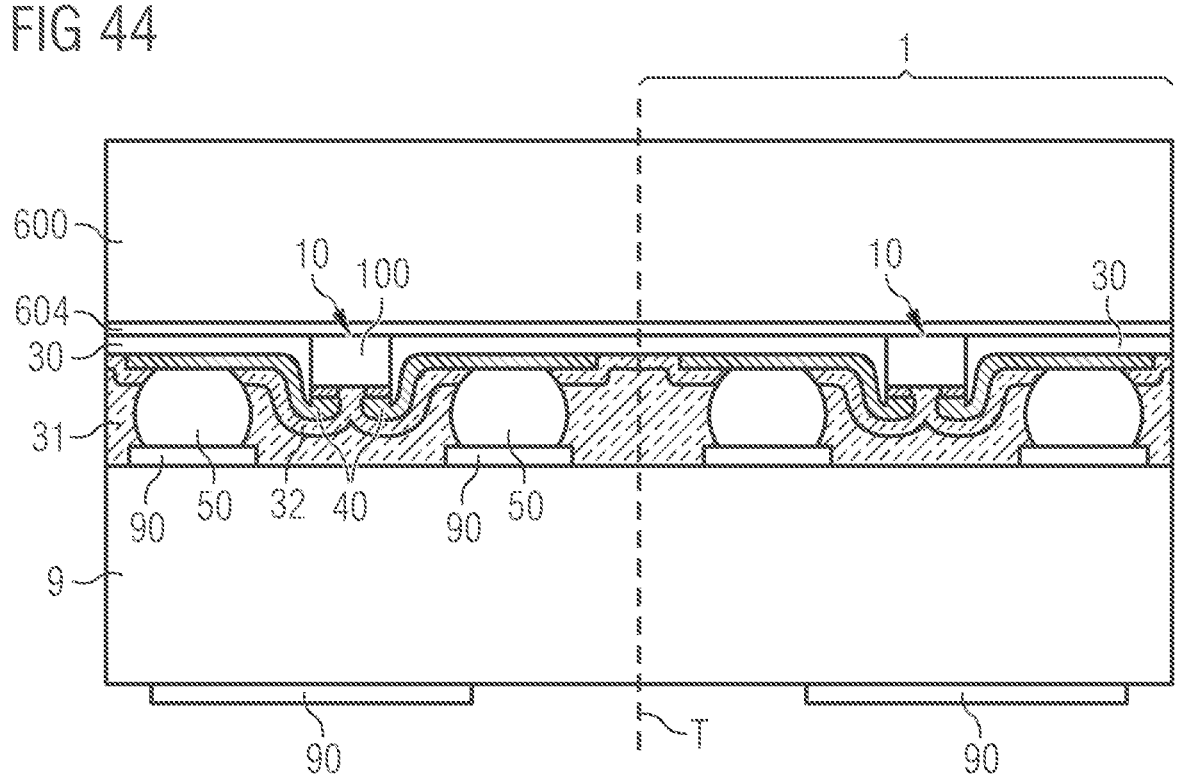
FIG. 44 shows a schematic sectional view of a plurality of arrangements described herein according to a forty fourth exemplary embodiment.

FIG. 44 shows a schematic sectional view of a plurality of arrangements 1 described herein according to a 44th exemplary embodiment. The 44th exemplary embodiment is substantially the same as the 43rd exemplary embodiment. In the 44th exemplary embodiment shown herein, a release layer 604 is arranged between the carrier 600 and the insulation layer 30. Advantageously, a joining layer 601 may be omitted. The release layer 604 is used to remove the carrier 600 from the arrangement 1 by means of a thermally or visually induced release process. Possible combinations of materials for the release layer and a suitable release process are listed below: SiNx+laser release, polyimide+laser release, thermal release film+thermal release, non-stick layer+mechanical release (GHT).

The invention is not limited by the description based on the exemplary embodiments. Rather, the invention encompasses any new feature as well as any combination of features, which particularly includes any combination of features in the patent claims, even if that feature or combination itself is not explicitly specified in the patent claims or exemplary embodiments.

The invention claimed is:

1. An arrangement comprising:
a plurality of optoelectronic semiconductor components arranged in a common plane, wherein each semiconductor component is laterally delimited by side faces, and wherein each semiconductor component comprises:
a semiconductor body comprising an active region configured to emit electromagnetic radiation,
a radiation outlet side configured to couple out the electromagnetic radiation,
a rear face opposite to the radiation outlet side, and
a contact structure arranged on the rear face;
an output element;
an electrically insulating insulation layer; and
an electrical connection structure,
wherein the insulation layer is arranged between side faces of adjacent semiconductor components and is absorbent or reflective of the electromagnetic radiation,
wherein the output element is arranged at the radiation outlet sides of the semiconductor components,
wherein the electrical connection structure is arranged on sides of the semiconductor components facing the rear faces and is electrically conductively connected with the contact structure,
wherein the electrical connection structure comprises an adhesive layer, a growth layer and a connection layer, and
wherein the semiconductor body comprises a semiconductor layer sequence and a radiation permeable substrate, wherein the active region is arranged within the semiconductor layer sequence, and wherein the substrate is arranged on a side of the semiconductor layer sequence opposite to the contact structures.

2. The arrangement according to claim 1, wherein the output element comprises a glass substrate, a polymer or a radiation permeable ceramic.

3. The arrangement according to claim 1, wherein the output element comprises, on a side facing away from the semiconductor bodies, a structuring configured to couple out the electromagnetic radiation.

4. The arrangement according to claim 1, wherein the output element comprises, in its lateral extent, a sequence of first radiation permeable regions and absorbing regions, and wherein, in each case, one first radiation permeable region is assigned to an optoelectronic semiconductor component.

5. The arrangement according to claim 4, further comprising a second radiation permeable region with a refractive index different from that of the first radiation permeable region is arranged in the first radiation permeable region.

6. The arrangement according to claim 1, wherein the insulation layer completely covers the output element between the side faces of the semiconductor components.

7. The arrangement according to claim 1, wherein the insulation layer completely covers the side faces of the semiconductor components.

8. The arrangement according to claim 1, wherein the side faces of the semiconductor components comprise a reflective coating, or wherein a cavity with reflective interfaces is formed between the insulation layer and the side faces, respectively.

9. The arrangement according to claim 1, wherein a thickness of the insulation layer corresponds to a thickness of the semiconductor components.

10. The arrangement according to claim 1, wherein the semiconductor components are arranged at least partially in recesses of the output element.

11. The arrangement according to claim 1, wherein the electrical connection structure is arranged as an electrically conductive layer on the insulation layer.

12. The arrangement according to claim 1, wherein the electrical connection structure is electrically conductively connected with a connection body, which forms a ball grid array or a land grid array.

13. The arrangement according to claim 1, further comprising a second insulation layer arranged on a side of the arrangement facing away from the output element serving to mechanically stabilize the arrangement.

14. The arrangement according to claim 1, wherein the output element comprises a peripherally extending trench.

15. A method for producing an arrangement, the method comprising:
providing a carrier and a radiation permeable joining layer on a first side of the carrier;
providing a plurality of optoelectronic semiconductor components, wherein each semiconductor component is laterally delimited by a side face, and wherein each semiconductor component comprises a semiconductor body, with an active region for emitting electromagnetic radiation, a radiation outlet side for coupling out the electromagnetic radiation, a rear face opposite to the radiation outlet side, and a contact structure arranged on the rear face;
applying the semiconductor components each with the radiation outlet side to the joining layer;
arranging an electrically insulation layer on the first side of the carrier;
exposing the contact structures; and
arranging a connection structure on sides of the semiconductor components facing the rear faces, wherein the connection structure comprises an adhesive layer, a growth layer, and a connection layer,
wherein the adhesive layer is arranged on a side facing the contact structure, and comprises Ti, Cr, Ni or Pd, and
wherein the growth layer is arranged between the adhesive layer and the connection layer.

16. The method according to claim 15, wherein the carrier is formed with a radiation permeable material and forms an output element together with the joining layer.

17. The method according to claim 15, further comprising detaching the carrier so that the joining layer forms an output element.

18. The method according to claim 17, wherein the carrier comprises a structuring on a side facing the joining layer, which structuring is imprinted into the joining layer.

19. An arrangement comprising:
a plurality of optoelectronic semiconductor components arranged in a common plane, wherein each semiconductor component is laterally delimited by side faces, and wherein each semiconductor component comprises:
a semiconductor body having an active region configured to emit electromagnetic radiation,
a radiation outlet side configured to couple out the electromagnetic radiation,
a rear face opposite to the radiation outlet side, and
a contact structure arranged on the rear face;
an output element;
an electrically insulating insulation layer; and
an electrical connection structure,
wherein the insulation layer is arranged between side faces of adjacent semiconductor components and is absorbent or reflective of the electromagnetic radiation,
wherein the output element is arranged at the radiation outlet sides of the semiconductor components,
wherein the electrical connection structure is arranged on sides of the semiconductor components facing the rear faces and is electrically conductively connected with the contact structures,
wherein the electrical connection structure comprises an adhesive layer, a growth layer and a connection layer,
wherein the adhesive layer is arranged on a side facing the contact structures, and comprises Ti, Cr, Ni or Pd, and
wherein the growth layer is arranged between the adhesive layer and the connection layer.

* * * * *